US006973613B2

(12) United States Patent
Cypher

(10) Patent No.: US 6,973,613 B2
(45) Date of Patent: Dec. 6, 2005

(54) ERROR DETECTION/CORRECTION CODE WHICH DETECTS AND CORRECTS COMPONENT FAILURE AND WHICH PROVIDES SINGLE BIT ERROR CORRECTION SUBSEQUENT TO COMPONENT FAILURE

(75) Inventor: Robert E. Cypher, Saratoga, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 561 days.

(21) Appl. No.: 10/185,265

(22) Filed: Jun. 28, 2002

(65) Prior Publication Data

US 2004/0003337 A1    Jan. 1, 2004

(51) Int. Cl.[7] ............................................. G11C 29/00
(52) U.S. Cl. ....................................... 714/773; 714/763
(58) Field of Search ................................ 714/763, 773

(56) References Cited

U.S. PATENT DOCUMENTS

| | | | |
|---|---|---|---|
| 4,376,300 A | | 3/1983 | Tsang |
| 4,434,459 A | * | 2/1984 | Holland et al. ............. 712/210 |
| 4,584,681 A | | 4/1986 | Singh et al. |
| 4,604,751 A | | 8/1986 | Aichelmann, Jr. et al. |
| 4,617,664 A | | 10/1986 | Aichelmann, Jr. et al. |
| 5,058,115 A | | 10/1991 | Blake et al. |
| 5,077,737 A | | 12/1991 | Leger et al. |
| 5,164,944 A | | 11/1992 | Benton et al. |
| 5,228,046 A | | 7/1993 | Blake et al. |
| 5,233,614 A | | 8/1993 | Singh |
| 5,251,219 A | | 10/1993 | Babb |
| 5,255,226 A | | 10/1993 | Ohno et al. |
| 5,276,834 A | | 1/1994 | Mauritz et al. |
| 5,291,496 A | | 3/1994 | Andaleon et al. |
| 5,463,644 A | * | 10/1995 | Rodi et al. .................. 714/766 |
| 5,490,155 A | | 2/1996 | Abdoo et al. |
| 5,502,675 A | | 3/1996 | Kohno et al. |
| 5,574,856 A | | 11/1996 | Morgan et al. |
| 5,640,353 A | | 6/1997 | Ju |
| 5,682,394 A | | 10/1997 | Blake et al. |
| 5,757,823 A | | 5/1998 | Chen et al. |
| 5,758,056 A | | 5/1998 | Barr |
| 5,812,564 A | | 9/1998 | Bonke et al. |

(Continued)

OTHER PUBLICATIONS

Polianskikh, B.; Zilic, Z.; Design and implementation of error detection and correction circuitry for multilevel memory protection; Multiple-Valued Logic, 2002. ISMVL 2002. Proceedings 32nd IEEE International Symposium on; May 5-18, 2002; pp. 89-95.*

(Continued)

*Primary Examiner*—R. Stephen Dildine
(74) *Attorney, Agent, or Firm*—Lawrence J. Merkel; Meyertons, Hood, Kivlin, Kowert & Goetzel, P.C.

(57) ABSTRACT

A memory controller comprises a check bit encoder circuit and a check/correct circuit. The check bit encoder circuit is coupled to receive a data block to be written to a memory comprising a plurality of memory devices, and is configured to encode the data block with a plurality of check bits to generate an encoded data block. The plurality of check bits are defined to provide at least: (i) detection and correction of a failure of one of the plurality of memory devices; and (ii) detection and correction of a single bit error in the encoded data block following detection of the failure of one of the plurality of memory devices. The check/correct circuit is coupled to receive the encoded data block from the memory and is configured to decode the encoded data block and perform at least the detection of (i) and (ii) on the encoded data block.

26 Claims, 20 Drawing Sheets

U.S. PATENT DOCUMENTS

| | | |
|---|---|---|
| 5,822,257 A | 10/1998 | Ogawa |
| 5,867,642 A | 2/1999 | Vivio et al. |
| 5,872,790 A | 2/1999 | Dixon |
| 5,909,541 A | 6/1999 | Sampson et al. |
| 5,923,682 A | 7/1999 | Seyyedy |
| 5,928,367 A | 7/1999 | Nelson et al. |
| 5,953,265 A | 9/1999 | Walton et al. |
| 5,978,952 A | 11/1999 | Hayek et al. |
| 5,987,628 A | 11/1999 | Von Bokern et al. |
| 6,009,548 A | 12/1999 | Chen et al. |
| 6,018,817 A | 1/2000 | Chen et al. |
| 6,038,680 A | 3/2000 | Olarig |
| 6,044,483 A | 3/2000 | Chen et al. |
| 6,052,818 A | 4/2000 | Dell et al. |
| 6,065,102 A | 5/2000 | Peters et al. |
| 6,070,255 A | 5/2000 | Dell et al. |
| 6,076,182 A | 6/2000 | Jeddeloh |
| 6,101,614 A | 8/2000 | Gonzales et al. |
| 6,115,828 A | 9/2000 | Tsutsumi et al. |
| 6,141,789 A | 10/2000 | Cypher |
| 6,158,025 A | 12/2000 | Brisse et al. |
| 6,167,495 A | 12/2000 | Keeth et al. |
| 6,181,614 B1 | 1/2001 | Aipperspach et al. |
| 6,209,113 B1 | 3/2001 | Roohparvar |
| 6,223,301 B1 | 4/2001 | Santeler et al. |
| 6,233,716 B1 | 5/2001 | Cypher |
| 6,233,717 B1 | 5/2001 | Choi |
| 6,246,616 B1 | 6/2001 | Nagai et al. |
| 6,282,686 B1 | 8/2001 | Cypher |
| 6,301,680 B1 | 10/2001 | Cypher |
| 6,301,780 B1 | 10/2001 | Templeton |
| 6,367,046 B1 | 4/2002 | Chapman et al. |
| 6,393,597 B1 | 5/2002 | Cypher |
| 6,453,440 B1 | 9/2002 | Cypher |
| 6,473,880 B1 | 10/2002 | Cypher |
| 6,477,682 B2 | 11/2002 | Cypher |
| 6,505,305 B1 * | 1/2003 | Olarig ........................ 714/5 |
| 2001/0001158 A1 | 5/2001 | Tetrick |
| 2003/0093744 A1 * | 5/2003 | Leung et al. ............... 714/763 |
| 2003/0163777 A1 * | 8/2003 | Holt .......................... 714/763 |
| 2003/0233611 A1 * | 12/2003 | Humlicek et al. .......... 714/763 |

OTHER PUBLICATIONS

IBM Technical Disclosure Bulletin, "Memory Chip Failure-Detection Mechanism", Mar. 1991, vol. 33, No. 10A, XP000110029, pp. 240-242.

Saxena, et al., "Error Detection and Handling in a Superscalar, Speculative Out-of-Order Execution Processor System," IEEE, 1995, pp. 464-471.

Rolf Johansson, "Two Error-Detecting and Correcting Circuits for Space Applications," IEEE 1996, pp. 436-439.

IBM Technical Disclosure Bulletin, "Concurrent On-Lin Array Chip Sparing From Scrub-Assisted Fault Data," Dec. 1991, vol. 34, No. 7A, pp. 16-19.

International Search Report for PCT/US 03/13751, mailed Mar. 5, 2004, 6 pages.

Shu Lin, "Error Control Coding, Fundamentals and Applications," Prentice-Hall 1983, pp. 503-525 and 532.

C. L. Chen, "Symbol Error Correcting Codes for Memory Applications," IBM Corporation, IEEE, 1996, pp. 200-207. IEEE Transactions of Computers, vol. 41, No. 2, Feb. 1992, 5 pages.

Hamada, et al., "A Class of Error Control Codes for Byte Organized Memory Systems -SbEC-(Sb+S)ED Codes-," IEEE Transactions of Computers, vol. 46, No. 1, Jan. 1997, 5 pages.

Costello, Jr., et al., "Applications of Error-Control Coding," IEEE Transactions on Information Theory, vol. 44, No. 6, Oct. 1998, pp. 2531-2560.

Ziegler, et al., "Cosmic Ray Soft Error Rates of 16-Mb DRAM Memory Chips," IEEE Journal of Solid-State Circuits, vol. 33, No. 2, Feb. 1998, pp. 246-252.

Peterson, et al., "Error-Correcting Codes," Second Edition, The MIT Press, 1972, pp. 357-373.

Dell Computer Corp., David Locklear, "Chipkill Correct Memory Architecture," Aug. 3, 2000, 3 pages.

Dell, "A White Paper on the Benefits of Chipkill-Correct ECC for PC Server Main Memory," IBM Microelectronics Division, Nov. 1997, pp. 1-23.

"The IBM Eserver pSeries 690, Reliability, Availability, Serviceability (RAS)," IBM Technical White Paper, Sep. 2001, 24 pages.

"Parallel Parity," http://bbs-koi.uniinc.msk.ru/tech1/1994/er_cont/block.htm, 1994, 1 pg.

"Modulo-2 Arithmetic," http://bbs-koi.uniinc.msk.ru/tech1/1994/er_cont/modulo.htm, 1994, 1 pg.

"Introduction to Error Control," http://bbs-koi.uniinc.msk.ru/tech1/1994/er_cont/intro.htm, 1994, 1 pg.

Barker et al. "ASCII Table," http://www.eng2.uconn.edu/cse/Cour...08W/References/Ref_ASCIITable.html, Feb. 1998, 1 pg.

"Parity & Computing parity," http://bbs-koi.uniinc.msk.ru/tech1/1994/er_cont/parity.htm, 1994, 2 pgs.

"Error Correction with Hamming Codes," http://bbs-koi.uniinc.msk.ru/tech1/1994/er_cont/hamming.htm, 1994, 2 pgs.

Barker et al. "Hamming Code, Background Information," http://www.eng2.unconn.edu/cse/Courses/CSE208W/Hamming/Background.html, Feb. 1998, 3 pgs.

Barker et al., "Hamming Code, Theory," http://www.eng2.uconn.edu/cse/Courses/CSE208W/Hamming/Theory.html, Mar. 1998, 2 pgs.

"NUMA: Delivering the Next Level of Commodity SMP Performance," http://199.245.235.23/newsletters/html/vpoint5.html, 1996, 4 pgs.

Barker et al. "General Definitions," http://www.eng2.uconn.edu/cse/Cour...8W/References/Ref_Definitions.html, Feb. 1998, 3 pgs.

Barker et al. "Hamming Code, Lab Procedure," http://www.eng2.uconn.edu/cse/Courses/CSE208W/Hamming/Procedure.html, Jun. 1998, 3 pgs.

Burskirk, "32-Bit-Wide Memory Tolerates Failures," NT Tech Notes, Oct. 1990, p. 818.

K.A.S. Immink; A Practical Method for Approaching the Channel Capacity of Constrained Channels; Sep. 1997; IEEE Transactions on Information Theory, Vo. 43, No. 5, pp. 1389-1399.

Fujiwara, E.; Kitakami, N.; A Class of Optimal Fixed-Byte Error Protection Codes for Computer Systems; Fault-Tolerant Computing, 1995. FTCS-25. Digest of Papers., Twenty-Fifth International Symposium on Jun. 27-30, 1995; pp. 310-319.

* cited by examiner

| DRAM # | Inner CB[10:0] | DED Bit (Inner CB[11]) |
|---|---|---|
| 0 | 00100011001 | 1 |
| !0 | 00100011101 | 0 |
| 1 | 00000000001 | 0 |
| 2 | 00011100001 | 1 |
| 3 | 11010101101 | 0 |
| 4 | 01001001101 | 0 |
| 5 | 10000001010 | 0 |
| 6 | 00001100010 | 0 |
| 7 | 11111011110 | 0 |
| 8 | 01001011001 | 0 |
| 9 | 11001011111 | 1 |
| 10 | 11001000111 | 1 |
| 11 | 10110110101 | 0 |
| 12 | 10000010010 | 0 |
| 13 | 00110011010 | 0 |
| 14 | 01110011001 | 1 |
| 15 | 10101110010 | 1 |
| 16 | 10101100000 | 1 |
| 17 | 10111011110 | 1 |
| 18 | 11000001101 | 0 |
| 19 | 11111010111 | 0 |
| 20 | 00100000010 | 1 |
| 21 | 11110101101 | 1 |
| 22 | 10100101011 | 1 |
| 23 | 11100110011 | 0 |
| 24 | 00001000010 | 1 |
| 25 | 01000010101 | 1 |
| 26 | 10011101011 | 0 |
| 27 | 01001110101 | 1 |
| 28 | 10010110101 | 1 |
| 29 | 10000000101 | 0 |
| 30 | 01001001110 | 0 |
| 31 | 01000010001 | 0 |
| 32 | 10110001111 | 0 |
| 33 | 00000000011 | 1 |
| 34 | 10100110010 | 0 |
| 35 | 00100010010 | 0 |

Fig. 10

$$f_0(In_{0:3}) = \begin{bmatrix} 1 & 0 & 0 & 1 \\ 1 & 1 & 0 & 0 \\ 0 & 1 & 1 & 0 \\ 0 & 0 & 1 & 0 \end{bmatrix} \cdot In_{0:3}$$

$$f_1(In_{0:11}) = \begin{bmatrix} 0 & 1 & 1 & 1 & 0 & 0 & 0 & 1 & 0 & 0 & 1 & 0 \\ 0 & 1 & 0 & 1 & 0 & 1 & 1 & 1 & 1 & 1 & 0 & 1 \\ 1 & 1 & 0 & 0 & 0 & 1 & 0 & 0 & 1 & 0 & 1 & 0 \\ 1 & 1 & 1 & 0 & 0 & 0 & 1 & 0 & 0 & 1 & 0 & 0 \end{bmatrix} \cdot In_{0:11}$$

$$f_2(In_{0:3}) = \begin{bmatrix} 1 & 0 & 0 & 0 \\ 0 & 1 & 0 & 0 \\ 0 & 0 & 1 & 0 \\ 1 & 1 & 1 & 1 \end{bmatrix} \cdot In_{0:3}$$

$$g_0(In_{0:3}) = \begin{bmatrix} 1 & 0 & 0 & 1 \\ 1 & 1 & 0 & 0 \\ 0 & 1 & 1 & 0 \\ 0 & 0 & 1 & 0 \\ 0 & 0 & 0 & 0 \\ 1 & 0 & 0 & 1 \\ 0 & 1 & 0 & 1 \\ 0 & 0 & 1 & 1 \end{bmatrix} \cdot In_{0:3}$$

$$g_1(In_{0:11}) = \begin{bmatrix} 1 & 0 & 0 & 1 & 1 & 1 & 1 & 0 & 0 & 1 & 1 & 1 \\ 1 & 0 & 1 & 1 & 1 & 1 & 1 & 0 & 0 & 0 & 0 & 1 \\ 0 & 1 & 0 & 1 & 1 & 1 & 1 & 1 & 0 & 0 & 0 & 1 \\ 1 & 0 & 1 & 1 & 0 & 0 & 0 & 1 & 1 & 1 & 1 & 0 \\ 1 & 0 & 1 & 0 & 1 & 0 & 0 & 1 & 1 & 1 & 0 & 0 \\ 0 & 0 & 1 & 0 & 0 & 1 & 0 & 1 & 1 & 1 & 0 & 0 \\ 0 & 1 & 1 & 0 & 0 & 0 & 1 & 1 & 1 & 1 & 0 & 0 \\ 1 & 1 & 0 & 1 & 1 & 1 & 1 & 0 & 1 & 0 & 1 & 1 \end{bmatrix} \cdot In_{0:11}$$

$$g_2(In_{0:3}) = \begin{bmatrix} 0 & 1 & 1 & 1 \\ 0 & 1 & 0 & 0 \\ 0 & 0 & 1 & 0 \\ 0 & 1 & 1 & 1 \\ 1 & 1 & 0 & 0 \\ 0 & 1 & 1 & 0 \\ 1 & 1 & 0 & 1 \\ 1 & 1 & 1 & 1 \end{bmatrix} \cdot In_{0:3}$$

Fig. 12

ERROR DETECTION/CORRECTION CODE WHICH DETECTS AND CORRECTS COMPONENT FAILURE AND WHICH PROVIDES SINGLE BIT ERROR CORRECTION SUBSEQUENT TO COMPONENT FAILURE

BACKGROUND OF THE INVENTION

1. Field of the Invention

This invention is related to the field of error checking and correction in memory systems and communication systems.

2. Description of the Related Art

Error codes are commonly used in electronic systems to detect and correct data errors, such as transmission errors or storage errors. For example, error codes may be used to detect and correct errors in data transmitted via any transmission medium (e.g. conductors and/or transmitting devices between chips in an electronic system, a network connect, a telephone line, a radio transmitter, etc.). Error codes may additionally be used to detect and correct errors associated with data stored in the memory of computer systems. One common use of error codes is to detect and correct errors of data transmitted on a data bus of a computer system. In such systems, error correction bits, or check bits, may be generated for the data prior to its transfer or storage. When the data is received or retrieved, the check bits may be used to detect and correct errors within the data.

Component failures are a common source of error in electrical systems. Faulty components may include faulty memory chips or faulty data paths provided between devices of a system. Faulty data paths can result from, for example, faulty pins, faulty data traces, or faulty wires. Additionally, memory modules, which may contain multiple memory chips, may fail. Circuitry which drives the data paths may also fail.

Another source of error in electrical systems may be so-called "soft" or "transient errors". Transient memory errors may be an error caused by the occurrence of an event, rather than a defect in the memory circuitry itself. Transient memory errors may occur due to, for example, random alpha particles striking the memory circuit. Transient communication errors may occur due to noise on the data paths, inaccurate sampling of the data due to clock drift, etc. On the other hand, "hard" or "persistent" errors may occur due to component failure.

Generally, various error detection code (EDC) and error correction code (ECC) schemes are used to detect and correct memory and/or communication errors. For example, parity may be used. With parity, a single parity bit is stored/transmitted for a given set of data bits, representing whether the number of binary ones in the data bits is even or odd. The parity is generated when the set of data bits is stored/transmitted and is checked when the set of data bits is accessed/received. If the parity doesn't match the accessed set of data bits, then an error is detected.

Other EDC/ECC schemes assign several check bits per set of data bits. The check bits are encoded from various overlapping combinations of the corresponding data bits. The encodings are selected such that a bit error or errors may be detected, and in some cases the encodings may be selected such that the bit or bits in error may be identifiable so that the error can be corrected (depending on the number of bits in error and the ECC scheme being used). Typically, as the number of bit errors that can be detected and/or corrected increases, the number of check bits used in the scheme increases as well.

SUMMARY OF THE INVENTION

In one embodiment, a memory controller comprises a check bit encoder circuit and a check/correct circuit. The check bit encoder circuit is coupled to receive a data block to be written to a memory comprising a plurality of memory devices, and is configured to encode the data block with a plurality of check bits to generate an encoded data block. The plurality of check bits are defined to provide at least: (i) detection and correction of a failure of one of the plurality of memory devices; and (ii) detection and correction of a single bit error in the encoded data block following detection of the failure of one of the plurality of memory devices. The memory controller is configured to write the encoded data block to the memory. The check/correct circuit is coupled to receive the encoded data block from the memory and is configured to decode the encoded data block and perform at least the detection of (i) and (ii) on the encoded data block. A method of encoding the data block with the check bits and writing the data block to memory is also contemplated.

In another embodiment, a memory controller comprises a check bit encoder circuit and a check/correct circuit. The check bit encoder circuit is coupled to receive a data block to be written to a memory comprising a plurality of memory devices, and is configured to encode the data block with a plurality of check bits to generate an encoded data block. The plurality of check bits are defined to provide at least: (i) detection and correction of a failure of one of the plurality of memory devices; and (ii) detection of a double bit error in the encoded data block following detection of the failure of one of the plurality of memory devices. The memory controller is configured to write the encoded data block to the memory. The check/correct circuit is coupled to receive the encoded data block from the memory and is configured to decode the encoded data block and perform at least the detection of (i) and (ii) on the encoded data block. The encoded data block in this embodiment is logically arranged as an array of rows (0 to R-1) and columns (0 to C-1) of bits. Each column comprises the bits stored in a different one of the plurality of memory devices. The plurality of check bits include a plurality of auxiliary check bits and a plurality of inner check bits. The plurality of auxiliary check bits are stored in a first column of the array, and each of the plurality of auxiliary check bits is in a row of the array and covers bits in the other columns of the array. Each of the plurality of inner check bits covers selected bits of the encoded data block except for the plurality of auxiliary check bits, and each bit of the array except for the plurality of auxiliary check bits has an associated assignment of one or more of the plurality of inner check bits that covers that bit. The assignments are selected to satisfy the following, where $syn(r_x, c_y)$ is the inner check bit syndrome (or more briefly, the inner syndrome, i.e. the syndrome over the inner check bits) associated with the bit at row x, column y of the array and XOR is bitwise exclusive OR:

for any set of rows $R_1$ of the array, wherein $R_1$ is not an empty set, and for any set of columns $c_1$ and $c_2$ of the array, wherein $c_1$ is not equal to $c_2$, an XOR of the syndromes over each position (r, c), where r is an element of R and c is an element of ($c_1$, $c_2$), is not equal to zero; and for any set of 2 distinct rows $r_1$ and $r_2$ and any set of 3 distinct columns $c_1$, $c_2$, and $c_3$, $syn(r_1, c_1)$ XOR syn $(r_2, c_2)$ XOR $syn(r_1, c_3)$ XOR $syn(r_2, c_3)$ is not equal to zero.

In another embodiment, a communication system includes a check bit encoder and a check/correct circuit. Coupled to receive a data block to be transmitted via a transmission medium comprising a plurality of paths, the check bit encoder circuit is configured to encode the data block with a plurality of check bits to generate an encoded data block. The plurality of check bits are defined to provide at least: (i) detection and correction of a failure of one of the plurality of paths; and (ii) detection and correction of a single bit error in the encoded data block following detection of the failure of one of the plurality of paths. Coupled to receive the encoded data block from the transmission medium, the check/correct circuit is configured to decode the encoded data block and perform at least the detection of (i) and (ii) on the encoded data block.

In still another embodiment, a communication system comprises a check bit encoder circuit coupled to receive a data block to be transmitted via a transmission medium comprising a plurality of paths. The check bit encoder circuit is configured to encode the data block with a plurality of check bits to generate an encoded data block, wherein the plurality of check bits are defined to provide at least: (i) detection and correction of a failure of one of the plurality of paths; and (ii) detection of a double bit error in the encoded data block following detection of the failure of one of the plurality of paths. The communication system further includes a check/correct circuit coupled to receive the encoded data block from the transmission medium and configured to decode the encoded data block and perform at least the detection of (i) and (ii) on the encoded data block. The encoded data block is logically arranged as an array of rows (0 to R-1) and columns (0 to C-1) of bits, and each column comprises the bits transmitted via a different one of the plurality of paths. The plurality of check bits include a plurality of auxiliary check bits and a plurality of inner check bits. The plurality of auxiliary check bits are in a first column of the array, and each of the plurality of auxiliary check bits is in a row of the array and covers bits in the other columns of the array. Each of the plurality of inner check bits covers selected bits of the encoded data block except for the plurality of auxiliary check bits, and each bit of the array except for the plurality of auxiliary check bits has an associated assignment of one or more of the plurality of inner check bits that covers that bit. The assignments are selected to satisfy the following, where $syn(r_x, c_y)$ is the inner syndrome associated with the bit at row x, column y of the array and XOR is bitwise exclusive OR:

for any set of rows $R_1$ of the array, wherein $R_1$ is not an empty set, and for any set of columns $c_1$ and $c_2$ of the array, wherein $c_1$ is not equal to $c_2$, an XOR of the syndromes over each position (r, c), where r is an element of R and c is an element of ($c_1, c_2$), is not equal to zero; and for any set of 2 distinct rows $r_1$ and $r_2$ and any set of 3 distinct columns $c_1, c_2$, and $c_3$, $syn(r_1, c_1)$ XOR $syn(r_2, c_2)$ XOR $syn(r_1, c_3)$ XOR $syn(r_2, c_3)$ is not equal to zero.

BRIEF DESCRIPTION OF THE DRAWINGS

The following detailed description makes reference to the accompanying drawings, which are now briefly described.

FIG. 10 is a table illustrating one embodiment of assignment of inner check bits to bits in various memory devices.

FIG. 12 is a diagram illustrating certain functions which may be used by one embodiment of the check bit encoder circuit shown in FIG. 11.

Figure 1:
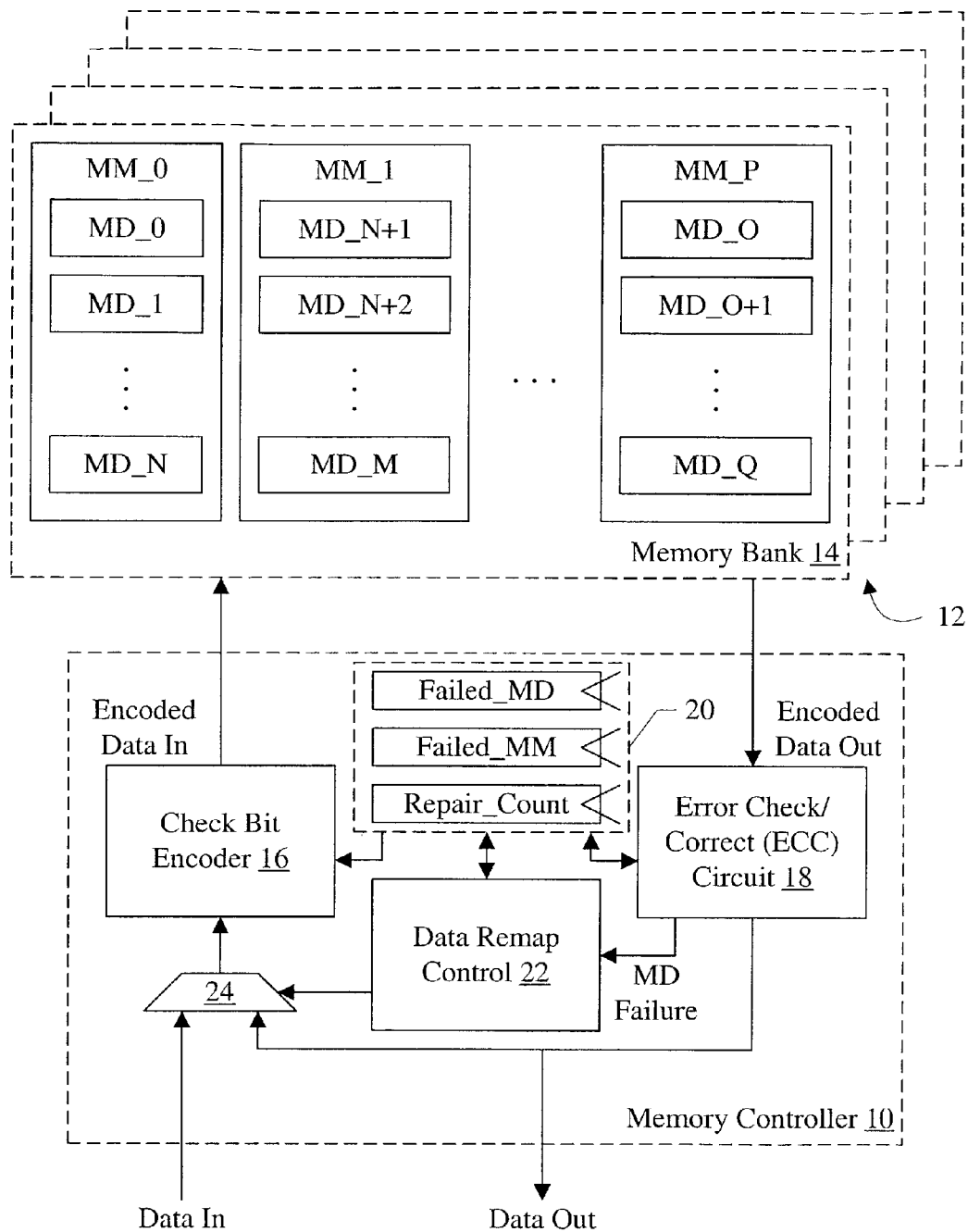
FIG. 1 is a block diagram of one embodiment of a memory controller coupled to a memory.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Turning now to FIG. 1, a block diagram of one embodiment of a memory controller 10 and a memory 12 comprising a plurality of memory banks including memory bank 14 is shown. Other embodiments are possible and contemplated. Each memory bank comprises a plurality of memory modules (e.g. MM_0 through MM_P in the memory bank 14 as shown in FIG. 1). Each memory module includes a plurality of memory devices (e.g. MD_0 through MD_N in MM_0, MD_N+1 through MD_M in MM_1, and MD_O through MD_Q in MM_P in FIG. 1). The memory controller 10 is coupled to the memory 12. In the illustrated embodiment, the memory controller 10 includes a check bit encoder circuit 16, an error check/correct (ECC) circuit 18, a persistent state storage 20, a data remap control circuit 22, and a multiplexor (mux) 24. The check bit encoder circuit 16 is coupled to the persistent state storage 20, to receive data from the mux 24, and to provide encoded data (encoded data in) to the memory 12 for storage. The ECC circuit 18 is coupled to receive encoded data read from the memory 12 (encoded data out) to provide corresponding data (data out) to the mux 24 and to output from the memory controller 10. The ECC circuit 18 is coupled to the persistent state storage 20 and to provide a MD failure signal to the data remap control circuit 22. The data remap control circuit 22 is coupled to the persistent state storage 20 and to the mux 24.

The memory controller 10 is coupled to receive read and write requests from various sources (e.g. processors and/or peripheral devices in a computer system including the memory controller 10). The memory controller 10 may have any interface for receiving the read and write requests (e.g. a bus interface, a packet interface, etc.). In one particular embodiment, the memory controller 10 may support input and output, unidirectional, source synchronous interfaces for transferring address and data packets comprising a request.

The memory controller 10 is configured to encode data to be written to the memory with a plurality of check bits, thus generating the encoded data to be stored in the memory. Generally, the encoded data comprises the data supplied to the memory controller and the check bits, arranged in a predetermined fashion for storage in the various memory devices of the memory 12. The data supplied for a given write may be stored in one of the memory banks 14, in one embodiment. Additionally, when encoded data is read from the memory 12, the ECC circuit 18 is configured to decode the encoded data to detect certain errors in the data and, in some cases, to correct the errors. The corrected data is supplied as an output of the memory controller 10 and is supplied as an input to the mux 24.

The data written to the memory 12 by the memory controller 10 may comprise data from a write request received by the memory controller 10 ("data in" in FIG. 1) or may comprise data read from the memory 12 for which an error was detected. For transient errors (e.g. single bit errors) in the data read from the memory 14, the corrected data may be written back to the memory 12. In other cases (e.g. a memory device failure), the data remap control circuit 22 may cause each encoded data block having bits stored in the failing memory device to be read and rewritten to the memory, remapped to avoid storing bits in the failing memory device. In either error case, the data remap control circuit 22 may select the data provided from the ECC circuit 18 through the mux 24 to the check bit encoder circuit 16. In non-error cases, the data input to the memory controller is selected through the mux 24.

The memory controller 10 may be configured to detect (and in some cases to correct) various errors through the encodings of the check bits. The errors may be transient (e.g. "soft") errors (such as single bit errors) or persistent (e.g. "hard") errors (such as the failure of a memory device or memory module). For example, in one embodiment, the check bits may provide for detection and correction of the failure of a memory device. The correction may include reconstructing the data that was stored in the failed memory device using the check bits and the data from the other memory devices. The correction may also include "mapping out" the failed memory device such that the failed memory device is no longer used to store bits of encoded data blocks. Following detection of the failure, the check bit encodings may continue to provide for single bit error detection and correction. The failing memory device may be mapped out by the data remap control circuit 22, which reads encoded data blocks having bits stored in the failing memory device and causes the data to be remapped (through the check bit encoder circuit 16) so that the failing memory device is not used to store any bits of the encoded data block. Once the data is remapped, the check bit encodings may provide for double bit error detection as well as single bit error detection and correction. In another embodiment, once the data is remapped, the check bit encodings may provide for double bit error detection as well as detection and correction of a failure of another memory device. In still another embodiment, the check bit encodings provide for the detection and correction of a failed memory device as well as the detection and probabilistic correction of a failed memory module (even following the detection and correction of a failed memory device). Single bit error detection and correction may be provided following the failure of a memory device and/or a memory module. Double bit error detection may be provided following the remapping of data from a failed memory device. Probabilistic correction refers to a correction mechanism that may correct errors with a certain probability, but there are at least some errors which are not correctable. A more detailed discussion of one embodiment of a method for defining the check bits to provide the above properties is provided below, as well as a specific example of one implementation.

The persistent state storage 20 is configured to record state information regarding the persistent failures which have been detected by the memory controller 10. For example, for some of the embodiments described above, the persistent state may include an indication of a failed memory device (Failed_MD in FIG. 1), an indication of a failed memory module (Failed_MM in FIG. 1), and a repair count which indicates how much data has been remapped in response to the detection of the failed memory device. The persistent state storage 20 may be formed from any type of persistent storage (e.g. registers, memory arrays, etc.).

A write request may supply up to a predetermined amount of data to be written to the memory, and similarly a read request may transfer up to a predetermined amount of data from the memory. For example, in one embodiment, a read or write request may supply a cache line of data. The cache line may be of any size (e.g. 32 bytes, 64 bytes, 128 bytes, etc.). In one particular implementation, a cache line may comprise 64 bytes of data (512 bits). The data supplied via a write request may further include metadata bits (e.g. 24 bits, in one implementation). Generally, metadata bits may be used to describe various properties of the corresponding cache line (e.g. type of data, coherency information, etc.). Any metadata used by the producers and consumers of the data (e.g. processors) may be encoded in the metadata.

The cache line may be divided into one or more data blocks. Check bits are generated for each data block independent of the other data blocks corresponding to a given cache line. In one implementation, two data blocks are defined, each having ½ of the data (e.g. 256 bits) and ½ of the metadata (e.g. 12 bits). The encoded data block (comprising the data bits, metadata bits, and the check bits arranged in a predetermined fashion) corresponding to each data block is referred to as a code word herein. Each code word is stored in a memory bank 14 of the memory 12. Particularly, a portion of the code word may be stored in each memory device within the memory bank 14.

As used herein, a memory device includes any memory packaged into a single device package having pins for accessing the memory device for writing and reading data stored therein. For example, a memory device may include a dynamic random access memory (DRAM) of any type (e.g. asynchronous DRAM, synchronous DRAM (SDRAM), RAMBUS DRAM (RDRAM), double data rate SDRAM (DDR SDRAM), etc.). A memory device may also include static RAM (SRAM), flash memory, etc. A memory device many include any memory which is subject to transient or persistent errors. In some embodiments, a memory device may be a single chip. A memory module is a circuit board to which two or more memory devices have been attached. For example, memory modules may include dual inline memory modules (DIMMs), single inline memory modules (SIMMs), and any other type of memory modules. In one particular embodiment, a memory module may include two or more memory devices which are part of one memory bank 14 and two or more memory devices which are included in a different memory bank.

As used herein, a check bit refers to a bit which is generated from two or more data bits for providing error detection in the data bits (and optionally, depending on the encodings of the check bits as a whole, error correction). A check bit is referred to as "covering" a given data bit if that data bit is used in the generation of the check bit (and thus the check bit aids in the error detection/correction of that data bit). For example, a check bit may be generated from the two or more data bits by exclusive OR (XOR) or exclusive NOR (XNOR) of the two or more data bits.

It is noted that various buffers and/or queues (not shown) may be included in the memory controller 10 as desired for buffering data. Furthermore, read and write requests to the memory 12 (included read and write requests generated during remapping of data in response to failed memory device) generally include an address to select the memory locations within each memory device of the bank that are read or written, control lines to control the access to the memory (including memory bank selection), etc., which have not been illustrated in FIG. 1. A means for writing the encoded data block to memory may comprise circuitry for driving the address, control, and data lines to the memory.

Figure 2:
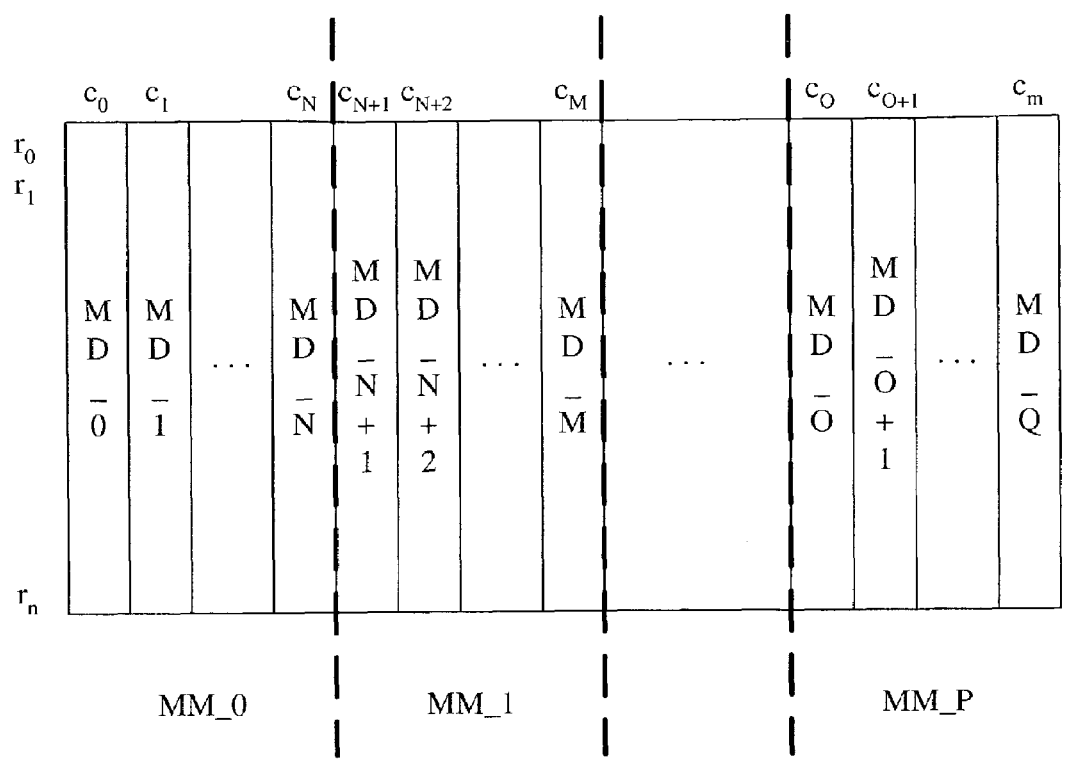
FIG. 2 is a block diagram illustrating a logical array of data bits forming one embodiment of a code word, indicating the storage of the bits in memory devices and memory modules.

FIG. 2 is a block diagram of one embodiment of a code word. Other embodiments are possible and contemplated. FIG. 2 illustrates the code word logically arranged as an array of rows and columns. Each column comprises the bits stored in one of the memory devices. Thus, the number of rows is equal to the number of bits of the code word supplied by each memory device. For example, column $0$ ($c_0$) are the bits of the code word stored in memory device $0$ (MD_0), column $1$ ($c_1$) are the bits of the code word stored in memory device $1$ (MD_1), etc. In some embodiments, (e.g. embodiments which detect memory module failures), the columns corresponding to memory devices on the same memory module may be located in consecutive columns of the array (e.g. columns $c_0$ to $c_N$, corresponding to MD_0 to MD_N, are the columns stored on the memory module MM_0, etc.). Heavy vertical dashed lines delimit the columns corresponding to various memory modules.

Method for Defining Check Bits—Double Bit Error Detection and Memory Device Failure Correction with Following Single Bit Error Correction One embodiment of a method for defining the check bit encodings to provide various error detection/correction properties based on the code word shown in FIG. 2 will next be described. For this embodiment, the check bits include a set of auxiliary check bits and a set of inner check bits. The auxiliary check bits are stored in a selected column of the code word (e.g., column zero, although any column may be selected). In one implementation, the auxiliary check bits may be row check bits. Each row check bit covers the bits that are in each other column of the code word and in the same row as that row check bit (e.g., the row check bit in row $r_0$ covers the bits that are in each other column and in row $r_0$). In another implementation, the auxiliary check bits may comprise a rotational XOR of the other bits. In embodiments that include the outer check bits (described below), the outer check bits are excluded from the auxiliary check bit generation.

Decoding the code word to detect an error may include XORing the bits in each row to generate a corresponding bit of an auxiliary syndrome. If the auxiliary syndrome is not zero, then an error has occurred. The decoding may further include other manipulations of the data and the auxiliary syndrome (and an inner syndrome over the inner check bits) to determine what the failure is and, in some cases, the correction to be performed. The assignment of inner check bits to cover various data bits causes an error in a given position in the logical array to generate the inner syndrome, and by appropriate assignment of check bits to data bits, various error detection and correction properties may be realized.

Generally, the auxiliary check bits may be used to identify the failure of a memory device, and to reconstruct the data bits which were stored in the failed memory device. For example, row check bits may be the XOR of each other bit in the same row, and thus may detect that a given bit in the row has changed (e.g. due to the failure of the memory device which stores that bit). By XORing the other bits in the row and the row check bit, the changed bit may be reconstructed. The failure of a memory device causes at least one row to indicate a failure. That is, the row check bits identify which rows of the logical array contain an error, but not which column the errors are in. The inner check bits may be assigned to cover various data bits to identify which particular memory device (which column of the code word array) has failed (thus permitting the reconstruction of the data from the failed memory device and the remapping of the code word to exclude the failed memory device). For the remainder of this discussion, "failed memory device" or "failed DRAM" and "failed column" may be used. The failed column may be the column of the array which corresponds to the failed memory device or failed DRAM.

In one embodiment, to identify the failed memory device, the data bits covered by the inner check bits may be assigned to satisfy the following rule (referred to below as "rule 1"): for any set of rows $R_1$ of the logical array, wherein $R_1$ is not an empty set, and for any set of columns $c_1$ and $c_2$ of the logical array, wherein $c_1$ is not equal to $c_2$, a bitwise XOR of the inner syndromes corresponding to each position $(r, c)$, where $r$ is an element of $R$ and $c$ is an element of $(c_1, c_2)$, is not equal to zero. If rule 1 is satisfied, then the inner syndrome corresponding to a given column failure is different for a given set of row failures. Thus, the column may be identified by testing each column with the auxiliary syndrome to detect which column has failed.

Figure 3:
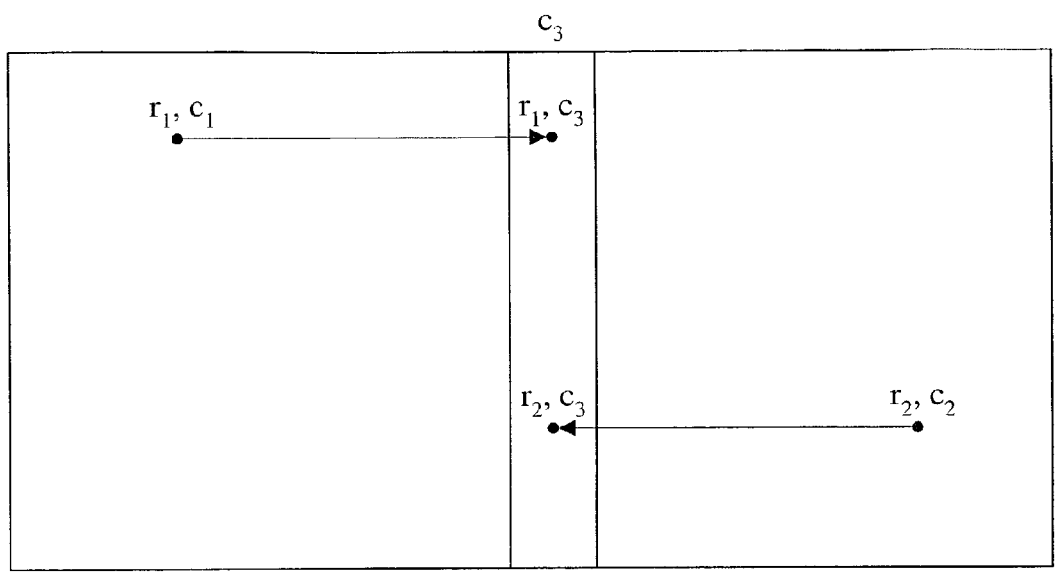
FIG. 3 is a block diagram illustrating a pair of bits and their projections into a column of FIG. 2.

After identifying that a given memory device (column) has failed, the remaining columns (including the row check bit column) may be used to reconstruct the failed column. If one of the remaining columns has a single bit error, that single bit error is then projected into the failed column. FIG. 3 may be used to illustrate the projection. If the column labeled $c_3$ has failed, and the bit ($r_1$, $c_1$) is in error, the reconstruction of bit ($r_1$, $c_3$) is also in error (since ($r_1$, $c_1$) is used to reconstruct ($r_1$, $c_3$)). The two errors are detectable (where syn($r_x$, $c_y$) is the inner syndrome calculated for an error at $(r_x, c_y)$) if $syn(r_1, c_1)$ XOR $syn(r_1, c_3)$ does not equal zero. Additionally, the errors are uniquely detectable (and thus correctable) among the possible errors that may be generated during the reconstruction if, for some other bit $(r_2, c_2)$ and its projection into the failed column $(r_2, c_3)$, the $syn(r_2, c_2)$ XOR $syn(r_2, c_3)$ is not equal to $syn(r_1, c_1)$ XOR $syn(r_1, c\ _3)$. If the above two conditions hold for each combination of rows $r_1$ and $r_2$ and each combination of columns $c_1$, $c_2$, and $c_3$ where $(r_1, c_1)$ is not equal to $(r_2, c_2)$ and $c_3$ is not equal to $c_1$, then the inner check bits provide for single bit error detection and correction. This rule for assignment of inner check bits to data bits, referred to as rule 2, is for any rows $r_1$ and $r_2$ and any columns $c_1$, $c_2$, and $c_3$ where $(r_1, c_1)$ is not equal to $(r_2, c_2)$ and $c_3$ is not equal to $c_1$; $syn(r_2, c_2)$ XOR $syn(r_2, c_3)$ XOR $syn(r_1, c_1)$ XOR $syn(r_1, c_3)$ is not equal to zero.

To provide double bit error detection prior to a memory device failing, the inner syndromes for a memory device failure that causes two bits to fail (e.g. $(r_1, c_3)$ and $(r_2, c_3)$ for a failure in column $c_3$) are different than the inner syndrome for a double bit failure (e.g. $(r_2, c_2)$ and $(r_1, c_1)$). Stated in another way, and referred to as rule 3, for any rows $r_1$, $r_2$ and columns $c_1$, $c_2$, and $c_3$, wherein $c_1$ is not equal to $c_2$; $syn(r_2, c_2)$ XOR $syn(r_2, c_3)$ XOR $syn(r_1, c_1)$ XOR $syn(r_1, c_3)$ is not equal to zero.

Rule 3 is covered by rule 2, and thus may be eliminated. Furthermore, rule 2 is covered, for the case $c_1$ equal to $c_2$ and not equal to $c_3$ and in the case $r_1$ is equal to $r_2$, by rule 1. Thus, a combination of rule 1 and rule 4 may be used to define the inner check bit assignments, where rule 4 is: for any sets of two distinct rows $r_1$ and $r_2$ and all sets of 3 distinct columns $c_1$, $c_2$, and $c_3$; $syn(r_2, c_2)$ XOR $syn(r_2, c_3)$ XOR $syn(r_1, c_1)$ $c_3)$ is not equal to zero.

While a variety of inner check bit assignments may meet rules 1 and 4, one embodiment of a method for meeting these rules is next described. For a prime P such that all non-trivial circulant P×P over GF(2) matrices have rank P-1, and the number of rows in the code word array is less than P: (i) select C (where C is the number of columns) distinct P-bit binary vectors $K_0$ to $K_{C-1}$ (referred to as keys, wherein $K_i$ is the key for column $c_i$) such that there does not exist a pair of keys $K_j$ and $K_1$ where $K_j$ XOR $K_1$ equals the all ones vector; and (ii) for each position $(r_1, c_1)$ in the array, let the P inner check bit assignments be defined by $K_1$ cyclically left shifted by $r_1$ positions. Note that, in one embodiment, the process represented by (i) may be accomplished by selecting any C keys, where $K_0$ is the all zero vector and the remaining keys are arbitrary, distinct, odd-weight P-bit binary vectors other than the all ones vector. The process represented by (i) and (ii) meets rule 1. Given this process, one way to meet rule 4 is to select $K_0$ to $K_{C-1}$ such that, for all sets of 3 distinct columns $c_1$, $c_2$, and $c_3$, $K_{c_1}$ XOR $K_{c_2}$ is not a cyclic shift of $K_{c_2}$ XOR $K_{c_3}$ (referred to as rule 5).

A matrix is circulant if each column is a cyclic shift of the previous column and the $i^{th}$ column is the $i^{th}$ cyclic shift of column zero. A matrix is non-trivial if it is not all zero or all one. A matrix has rank r if all sets of r or fewer rows are linearly independent. A matrix is over GF(2) if each element in the matrix is in GF(2). That is, the elements of the matrix are in a Galois Field ("GF") with 2 elements, namely 0 and 1, in which addition is defined as the exclusive OR operator and multiplication is defined as ordinary integer multiplication.

As will be described in more detail below, in one embodiment, a failed memory device is mapped out by using the memory device that formerly stored the auxiliary check bits to store the bits from the failed memory device (and the auxiliary check bits are no longer stored). In one embodiment, the inner check bit assignments selected using the above-described process may be selected such that, after mapping out the failed memory device, the same inner syndromes are used for each column of data as were used prior to the mapping out (and the inner syndrome associated with the data that is stored in the failed column is still assigned to that data, although it is stored in a column previously storing the auxiliary check bits). In such an embodiment, to ensure that single bit error detection and correction is still provided after the remapping, a rule 6 may be used: For all distinct positions $(r_1, c_1)$ and $(r_2, c_2)$ where $c_1$ and $c_2$ are not the column storing the auxiliary check bits (e.g. column zero); $syn(r_1, c_1)$ before the remapping is not equal to $syn(r_2, c_2)$ before the remapping.

Furthermore, for double bit error detection after remapping, the inner check bit assignments may further be selected to meet a rule 7: For all distinct positions $(r_1, c_1)$, $(r_2, c_2)$, and $(r_3, c_3)$ where $c_1$, $c_2$, and $c_3$ are not the column previously storing the auxiliary check bits; $syn(r_1, c_1)$ XOR $syn(r_2, c_2)$ XOR $syn(r_3, c_3)$ is not equal to zero. Rule 7 may be met, for example, by selecting inner check bit assignments with odd weights (that is, odd numbers of check bits are assigned to cover each data bit).

In one implementation, storage locations within the code word may be assigned which avoid cyclic dependencies between the auxiliary check bits and the inner check bits. For example, the auxiliary check bits may be assigned to any column and the syndromes for that column (prior to remapping a failed memory device) may be defined to be zero. In one particular implementation, the auxiliary check bits may be assigned to column zero. The inner check bits 0 through R-1 (where R is the number of rows in the logical array) may be assigned to a different column (e.g. column 1) and the key for that column (e.g. $K_1$) may be selected as $(0, 0, 0, \ldots, 0, 1)$. The remaining inner check bits may not be stored, instead selecting a set of inner parity dual bits, equal in number to the remaining check bits, and select these bits such that the remaining inner check bits evaluate to zero.

Method for Defining Check Bits—Memory Module Failure with Following Single Bit Error Correction In an embodiment which detects memory module failures as well (using outer check bits stored in a redundant memory module, each of which covers the corresponding bits in the other memory modules, for example), a rule 8 may be used to provide single bit error correction following a memory module failure (in combination with rule 1 above), assuming that consecutive columns are the memory devices on a given memory module: for all rows $r_1$ and $r_2$ and all columns $c_1$, $c_2$, $c_3$, and $c_4$, wherein $(r_1, c_1)$ is not equal to $(r_2, c_2)$, $c_1$ and $c_3$ are corresponding columns of different memory modules, and $c_2$ and $c_4$ are corresponding columns of different memory modules and $c_3$ and $c_4$ are columns in the same memory module; $syn(r_1, c_1)$ XOR $syn(r_2, c_2)$ XOR $syn(r_1, c_3)$ XOR $syn(r_2, c_4)$ is not equal to zero.

It is noted that, in other embodiments, memory module failure may be detected and corrected without performing memory device failure detection and correction, if desired.

Remapping for a Failed Memory Device

As mentioned above, in some embodiments, a failed memory device is mapped out of the code words that previously used the failed memory device. In other words, the failed memory device is not used to store bits of the code words. Generally, the data from the failed memory device may be stored in one or more of the remaining memory devices, depending upon where the available storage for the bits may be. For example, metadata bits stored in one or more other columns may not be logically used by the producers and consumers of the data. These metadata bits may be used to store the bits from the failed memory device. In some embodiments in which both auxiliary check bits and outer check bits are used, the data may be remapped to the auxiliary check bits column. In other embodiments, failed columns may be remapped to the outer check bits columns.

Figure 4:
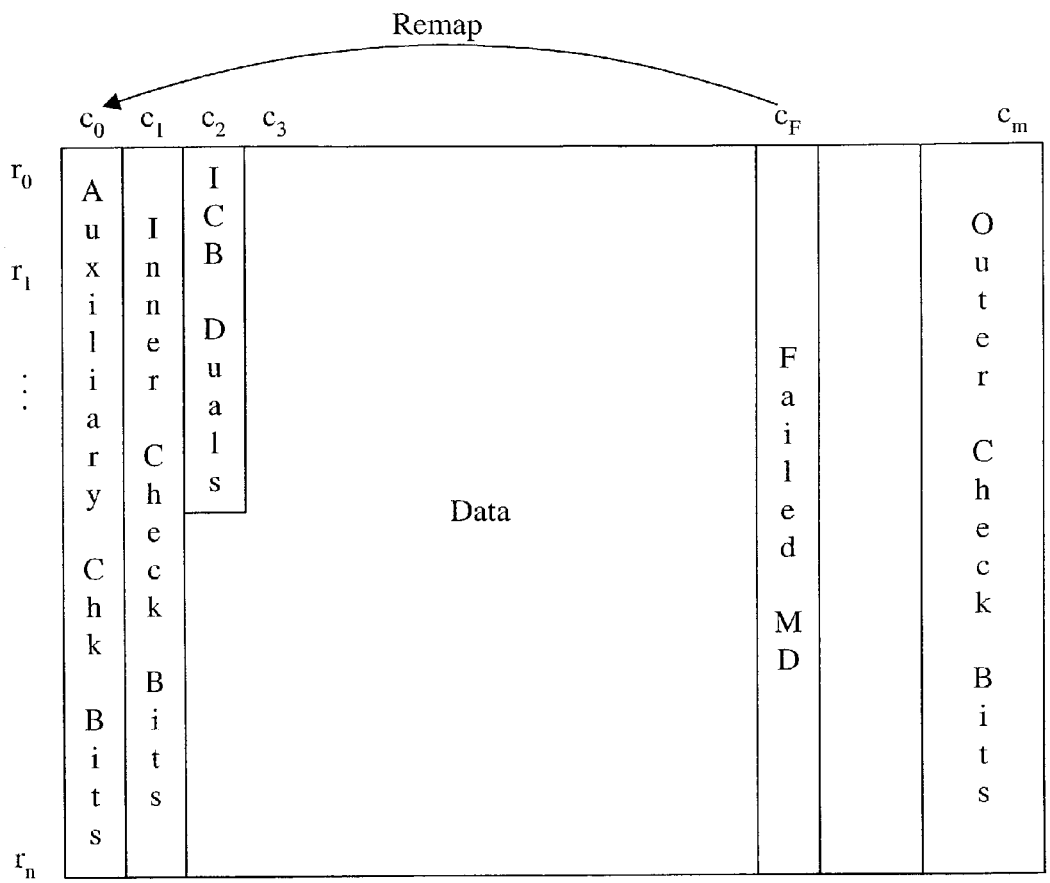
FIG. 4 is a block diagram illustrating one embodiment of a code word and remapping a column in the code word.

FIG. 4 illustrates a first embodiment of a code word with a remapping of a column corresponding to a memory device that has failed. Other embodiments are possible and contemplated. In FIG. 4, a column $c_F$ is shown which corresponds to a failed memory device. The column $c_F$ is remapped to the column $c_0$, which previously stores the auxiliary check bits in this embodiment. The inner check bits are stored in column $c_1$, and the inner check bit duals are stored in a portion of the column $c_2$. The outer check bits are stored in two or more columns ending in $c_m$, where the number of columns is equal to the number of memory devices in the memory bank and on a given memory module. The outer check bits may be an exclusive OR of the bits in the same position (row and column) within each of the other memory modules. Thus, the outer check bits include enough information to identify failing rows, and the auxiliary check bits may be redundant, in such embodiments.

Figure 5:
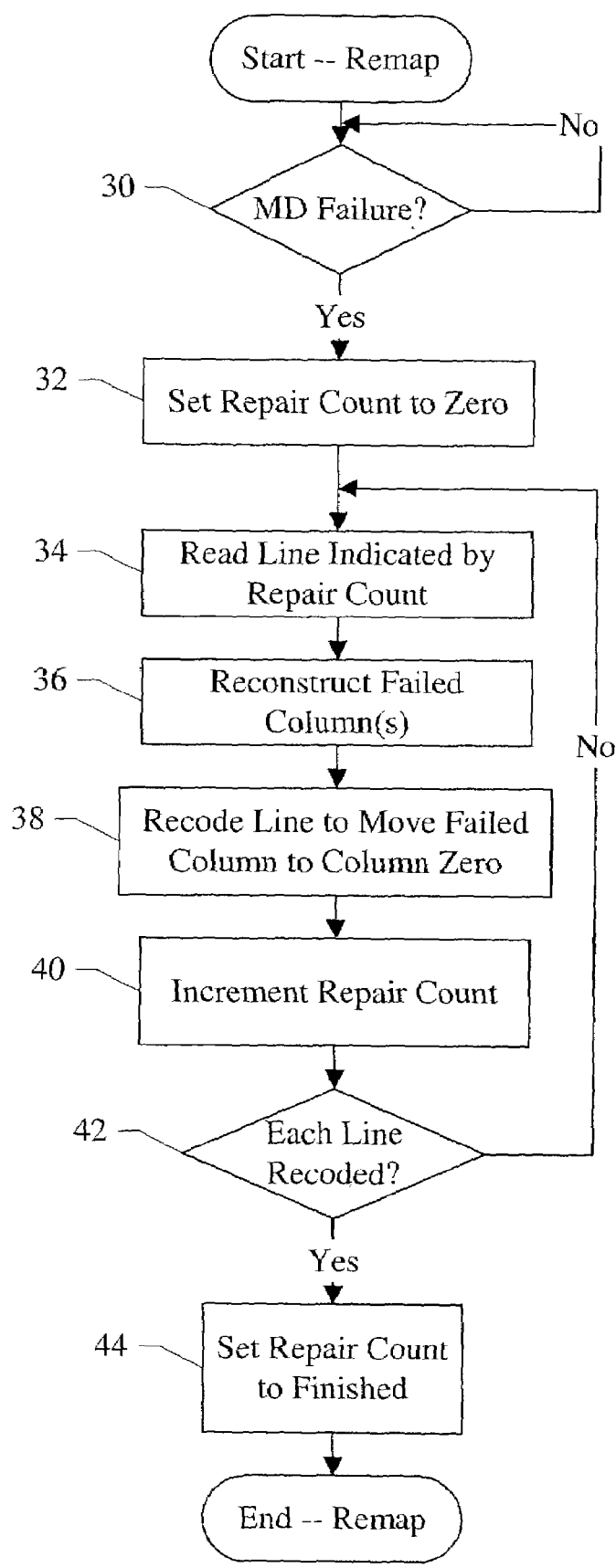
FIG. 5 is a flowchart illustrating the operation of one embodiment of the memory controller for remapping code words after detection of a failed memory device according to the embodiment shown in FIG. 4.

FIG. 5 is a flowchart illustrating operation of one embodiment of the memory controller 10 for remapping cache lines (comprising one or more code words) to avoid storing bits in a failed memory device. Other embodiments are possible and contemplated. While the blocks shown in FIG. 5 are illustrated in a particular order for ease of understanding, any order may be used. Blocks may indicate operation of various combinatorial logic circuitry implemented in the memory controller 10, and thus may be performed in parallel.

The data remap control circuit 22 may generally control the remapping of the cache lines, using the check bit encoder circuit 16 and the ECC circuit 18 to perform decoding and encoding of the data. The data remap control circuit 22 receives an indication that a memory device failure has been detected (decision block 30—yes leg). Prior to receiving the indication of the memory device failure, the data remap control circuit 22 may be idle. A memory device failure may be indicated in a variety of fashions. For example, in the embodiment of FIG. 1, an MD failure signal is shown from the ECC circuit 18. In response to detecting that a memory device has failed during a read of data from the memory, the ECC circuit 18 may assert the MD failure signal. In other embodiments, for example, the data remap control circuit 22 may detect the memory failure by examining the persistent state storage 20. The failed_MD value may include a value which indicates no failure (or there may be a valid bit for the failed_MD value). In response to the failed_MD value changing from no failure to indicating a particular memory device, the data remap control circuit 22 may determine that a failure has been detected.

Once a failure has been detected, the data remap control circuit 22 initiates the repair process by which each cache line (and thus each code word comprising the cache line) is remapped to eliminate the storage of bits in the failed memory device. The data remap control circuit 22 sets the repair count in the persistent state storage 20 to zero (block 32). The repair count may be used as an address to the memory bank 14, selecting each cache line stored in the memory bank in turn until each cache line has been processed.

The data remap control circuit 22 initiates a read of the cache line indicated by the repair count (block 34). The encoded cache line of read data is returned to the ECC circuit 18.

The ECC circuit 18 decodes each code word, reconstructs the data from the failed memory device, and delivers the data to the mux 24, through which the data remap control circuit 22 selects the data (block 36). If a single bit error is also detected in the data after reconstruction, the ECC circuit 18 corrects the single bit error (and its projection into the reconstructed data). The check bit encoder circuit 16 recodes the code words in the cache line, moving the data that would be stored in the failed column to column zero (the column storing the auxiliary check bits) (block 38). If the failed column is column zero, then the auxiliary check bits may merely be eliminated. The data remap control circuit 22 initiates a write to write the recoded line back to memory.

The data remap control circuit 22 increments the repair count (block 40) and determines if each line has been successfully recoded (decision block 42). If not, the data remap control circuit initiates the read of the next line (block 34) and the process continues. If so, the data remap control circuit 22 sets the repair count to a value indicating finished (block 44) and the remapping is complete. The value may indicate finished by being larger than the number of cache lines stored in the bank, for example, or may include a valid bit. Alternatively, the persistent state may include another bit to indicate that the remap is finished.

It is noted that, in one embodiment, after a code word is remapped to use column zero to store the bits from the failed column, column zero is then covered by the inner check bits. An assignment of inner check bits may be made that meets rules 1, 4, 5, 6, and 7 above (and meets rule 8, if memory module failure is also detected). Thus, the encoding and decoding of the code words may take into account, for a given cache line, whether it has been remapped or not.

It is noted that, during the remapping process shown in FIG. 5, other memory requests may be received by the memory controller 10. The memory controller 10 may service these requests, interrupting the remapping process temporarily.

Figure 6:
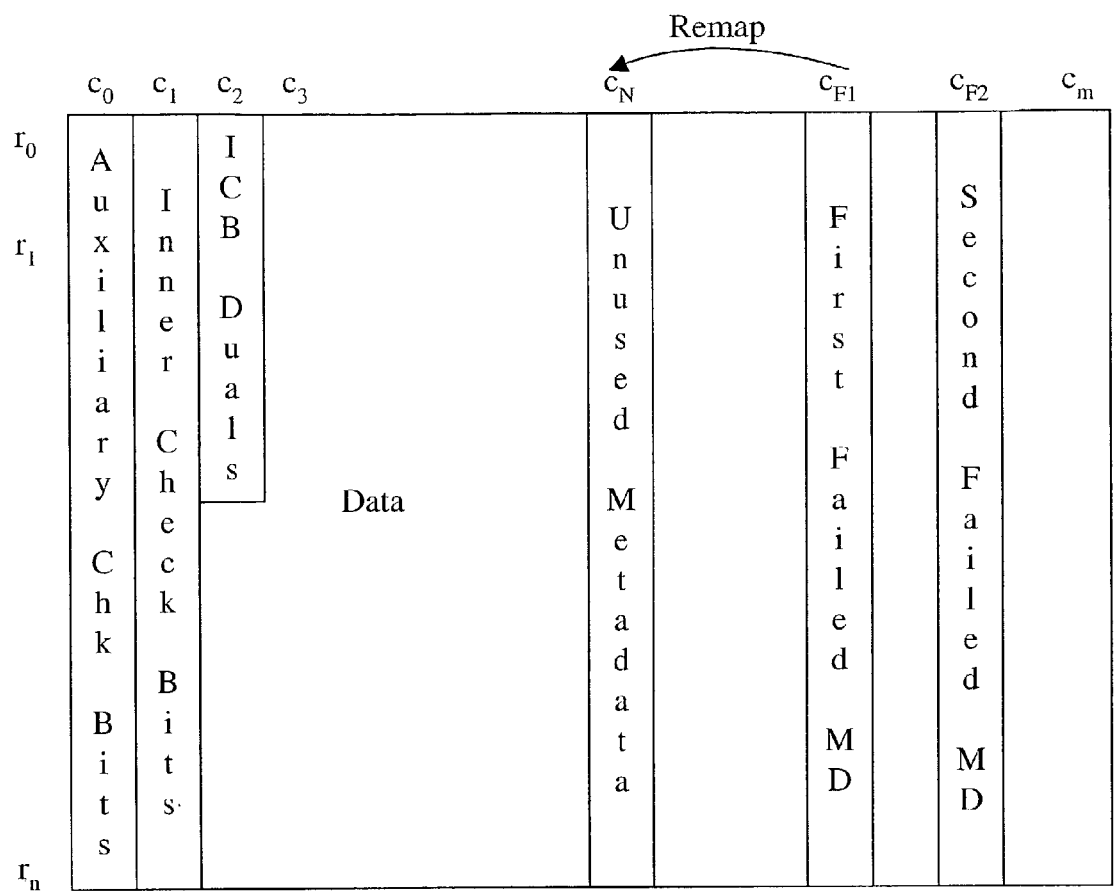
FIG. 6 is a block diagram illustrating a second embodiment of a code word and remapping columns in the code word.

FIG. 6 illustrates a second embodiment of a code word with a remapping of a failed memory device and a subsequent detection and correction of a second failed memory device. Other embodiments are possible and contemplated. The embodiment of FIG. 6 may thus detect and correct, including remapping, a first memory device failure followed by detecting and correcting a second memory device failure. Additionally, single bit error correction (and double bit error detection, following the remapping) may be performed in this embodiment.

In the embodiment of FIG. 6, a column $c_N$ stores some of the metadata portion of the data supplied for reads and writes. Particularly, the metadata stored in the column $c_N$ is logically not used by the producers and consumers of the data. The producers of the data may set the unused metadata to a constant value (e.g. binary zeros, binary ones, or any constant combination of binary zeros and ones). Accordingly, the first failed memory device (corresponding to column $c_{F1}$ in FIG. 6) may be remapped to the column storing the unused metadata (column $c_N$). A second failed memory device (e.g. column $c_{F2}$ in FIG. 6) may then be detected and corrected (by reconstructing its data using the auxiliary check bits and inner check bits). This embodiment may be used even if the outer check bits are not used (although this embodiment may also be used if the outer check bits are used). In yet another embodiment, the memory controller may be configured to terminate memory module failure detection/correction and may remap failed columns to the columns previously used to store outer check bits. In other embodiments with additional logically unused columns, additional memory device failures may similarly be remapped to those unused columns. As mentioned above, the unused bits may also be in a number of different columns (along with other bits that are used), and the remapping of a failing column to the unused bits in several different columns may be performed in a manner similar to the remapping of the failing column to an unused column.

In such an embodiment, the persistent state 20 may include storage for multiple failing memory devices, to record each failed memory device as it is detected.

Figure 7:
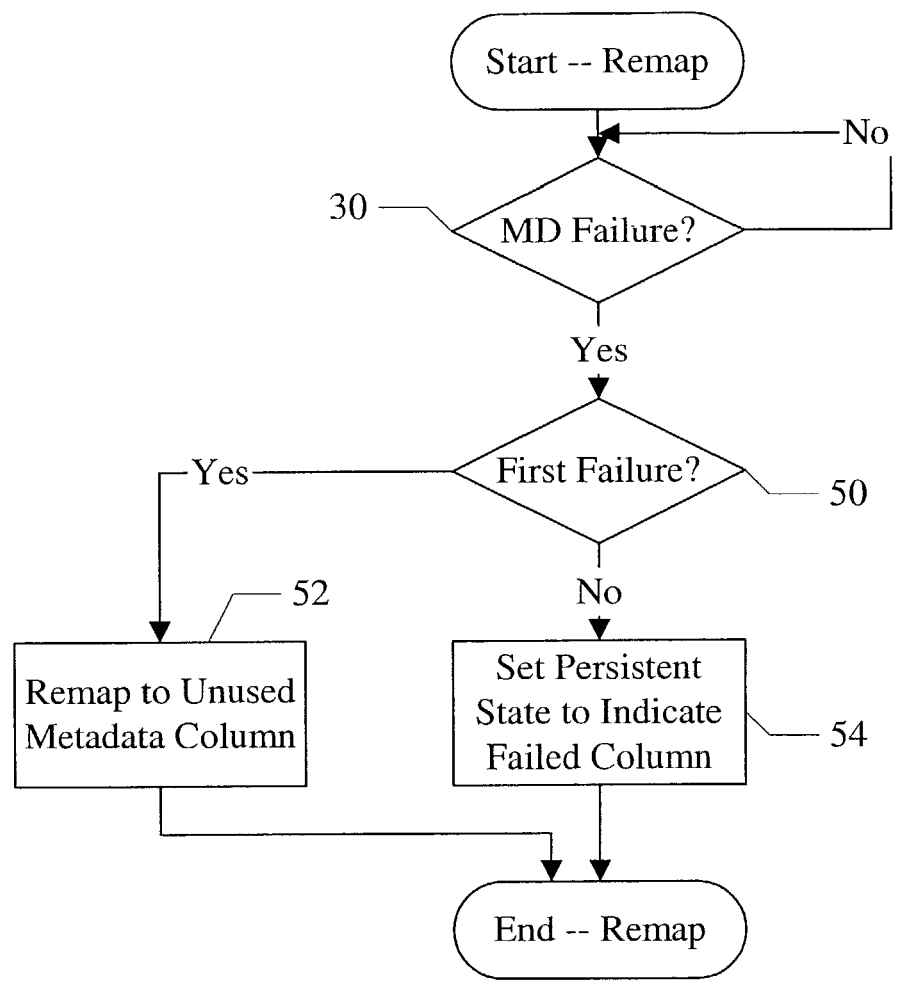
FIG. 7 is a flowchart illustrating the operation of a second embodiment of the memory controller for remapping code words after detection of failed memory devices according to the embodiment shown in FIG. 6.

FIG. 7 is a flowchart illustrating operation of one embodiment of the memory controller 10 for remapping cache lines (comprising one or more code words) to avoid storing bits in a first failed memory device and for subsequently correcting for a second failed memory device. Other embodiments are possible and contemplated. While the blocks shown in FIG. 7 are illustrated in a particular order for ease of understanding, any order may be used. Blocks may indicate operation of various combinatorial logic circuitry implemented in the memory controller 10, and thus may be performed in parallel.

Similar to the embodiment of FIG. 5, the data remap control circuit 22 may determine if a memory device failure has been detected (block 30). If not, the data remap control circuit 22 may be idle. If so, the data remap control circuit 22 may determine, from the persistent state 20, whether or not the memory device failure is the first failure (decision block 50). If so, the data remap control circuit 22 may remap the failing column to the unused metadata column (block 52). If not, the data remap control circuit 22 may record the second failed column in the persistent state storage 20, so that subsequent reads from the memory bank may lead to the data from the second failed column being reconstructed (block 54). Block 52 comprise a similar series of operations as blocks 32–44 in FIG. 5.

In embodiments having additional logically unused columns (or a number of unused bits in multiple columns equal to the number of bits in a column), the flowchart of FIG. 7 may be expanded to remap blocks to each of the unused columns for the first several memory device failures, and then recording of the last failure for reconstruction. It is noted that failing memory modules may be remapped in a similar fashion if additional unused memory modules are included.

Additional Details, Exemplary Implementation.

FIGS. 8–18 illustrate an exemplary implementation of a memory controller 10. For this implementation, the memory devices may be DRAMs embodiment on DIMMs as memory modules. Thus, DRAMs and DIMMs will be referred to in this example, although the example could be implemented with other memory devices and memory modules, as desired. Thus, the persistent state may include a failed_DRAM indication and a failed_DIMM indication. In particular for this example, each DRAM may supply 4 bits of data per cycle, and two cycles may be used to read/write a code word worth of data from the DRAM. A DIMM module includes 4 DRAMs within a given memory bank in this example. There are two code words per cache line in this example (i.e. four cycles of data are read/written from the DRAMs per cycle). The number of DIMMs per bank is either 9 (if DIMM failure detection is not being supported) or 10 (if DIMM failure detection is being supported), and thus there are either 36 or 40 DRAMs included. The DRAMs are numbers in consecutive order across the DIMMs (e.g. DIMM_0 includes DRAM_0, DRAM_1, DRAM_2, and DRAM_3; DIMM_1 includes DRAM_4, DRAM_5, DRAM_6, and DRAM_7, etc.). It is noted that, while specific details are given in this exemplary implementation, numerous other implementations are possible which vary one or more of the details.

The exemplary implementation supports two modes of operation. In the first mode, DRAM failure detection and correction (including mapping out the failing DRAM) is supported. Single bit error correction is supported. Double bit error detection is supported except during the remapping process. The first mode is used if 9 DIMMs are included in a bank. In the second mode, the DRAM failure detection and correction is supported, including the single bit error correction and double bit error detection as mentioned above, as well as DIMM failure detection (including DIMM failure detection after a DRAM failure has been detected and mapped out). In this mode, a $10^{th}$ DIMM is included for storing check bits used for DIMM failure detection.

Generally, a given cache line in this implementation may be viewed as having one of 5 states based on the persistent state, and the states may affect the encoding and decoding of the code words for the cache line. The states allow the memory controller 10 to determine whether or not the code words have a remapped column (and thus the generation of the inner check bits and the location of data in the code word may be different). The encoding prior to mapping out a failed DRAM is referred to as encoding #1, and corresponds to FIGS. 8 and 9 and the table in FIG. 10, ignoring the entries for column zero. The encoding subsequent to the mapping out is referred to as encoding #2, and includes use of the entries for column zero in the table of FIG. 10 and the use of column zero to store the data remapped from the failing column. These states are as follows:

1. State_1: No persistent failure is detected. Encoding #1 is used. This is the state if the failed_DRAM is Null (does not indicate one of DRAMs 0–39) and the failed_DIMM is Null (does not indication of DIMMs 0–9).

2. State_1R: A DRAM failure has been detected and identified, but this cache line has not been recoded to map out the failed DRAM. Encoding #1 is used. This is the state if the failed_DRAM is not Null, the failed_DIMM is Null, and the repair count is less than the cache line address in the bank.

3. State_2R: A DRAM failure has been detected and identified, and this cache line has been recoded to map out the failed DRAM. Encoding #2 is used. This is the state if the failed DRAM is not Null, the failed DIMM is Null, and the repair count is greater than the cache line address in the bank.

4. State_1D: A DIMM failure has been detected and identified, and this cache line is in encoding #1. In other words, a DIMM failure was detected prior to a DRAM failure or during remapping of a DRAM failure within the DIMM. This is the state if the failed_DRAM is Null or the repair count is less than the cache line address within the bank, and the failed_DIMM is not Null.

5. State_2RD: A DIMM failure has been detected and identified, and this cache line is in encoding #2 (a failed DRAM was mapped out prior to the failed DIMM detection). This is the state if the failed DRAM is not Null, the repair count is greater than the cache line address in the bank, and the failed_DIMM is not Null.

Figure 8:
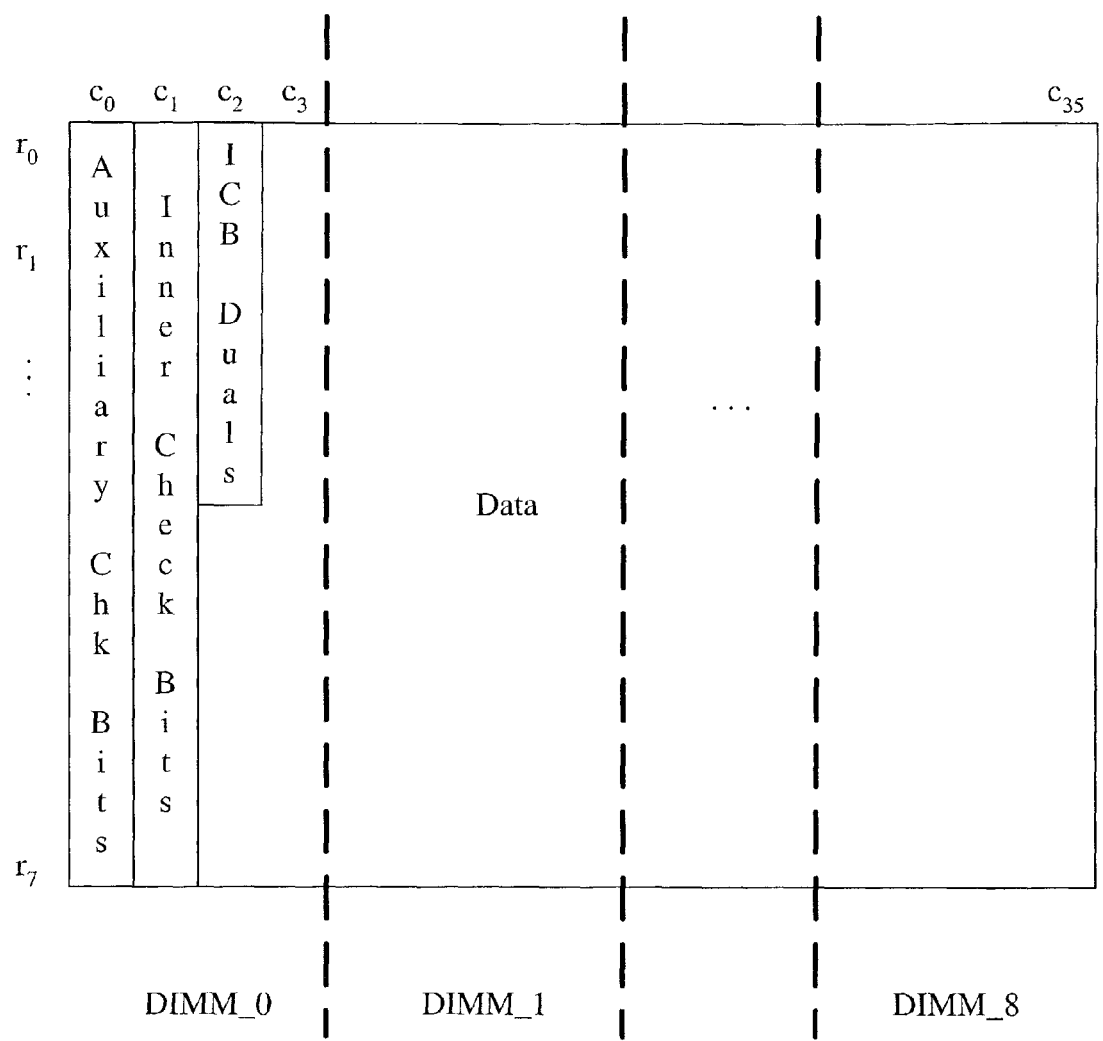
FIG. 8 is a block diagram illustrating one embodiment of a code word, including check bits therein.

FIG. 8 is a block diagram of one embodiment of a code word for the exemplary implementation in the first mode. Other embodiments are possible and contemplated. The embodiment of FIG. 8 includes 36 columns ($c_0$ through $c_{35}$, corresponding to the 36 DRAMs included in the first mode). There are 9 DIMMs (DIMM_0 to DIMM_8), each including four DRAMs within the memory bank and thus having four consecutive columns in the code word. There are 8 rows in the code word, for the 8 bits stored in a given DRAM for the code word.

Column zero stores the auxiliary check bits, which in this implementation are row check bits. In other implementations, the auxiliary check bits may be rotational XOR bits similar to the second mode. Column 1 stores the least significant 8 bits of the inner check bits, and the first four rows of column 2 are the inner check bit duals, which are generated to cause the most significant 4 bits of the inner check bits to be zero. Thus, 12 inner check bits are used in the present embodiment. The remaining bits of the code word store data, including metadata.

Figure 9:
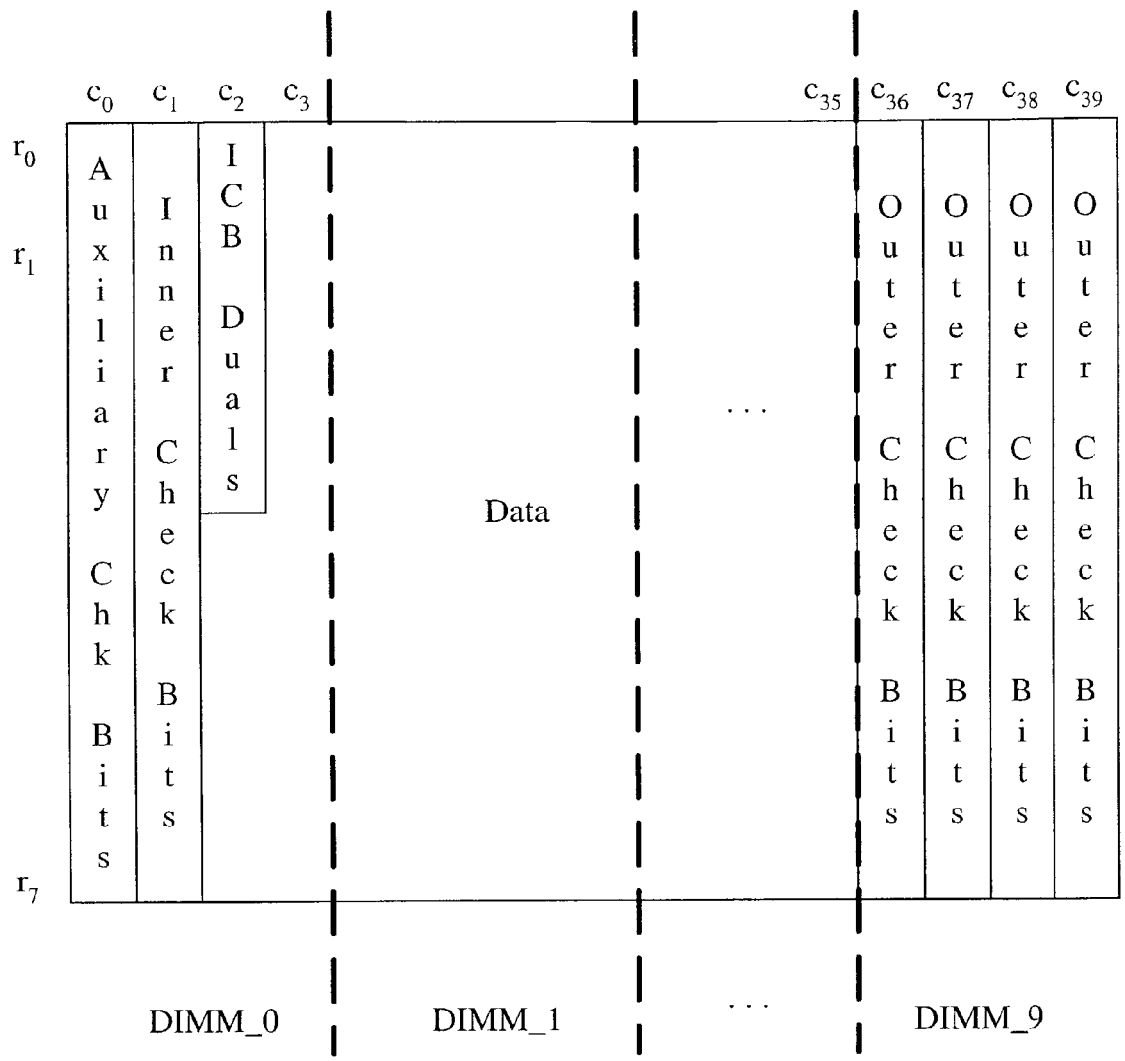
FIG. 9 is a block diagram illustrating a second embodiment of a code word, including check bits therein.

FIG. 9 is a block diagram of one embodiment of a code word for the exemplary implementation in the second mode. Other embodiments are possible and contemplated. The embodiment of FIG. 9 includes 40 columns ($c_0$ through $c_{39}$, corresponding to the 40 DRAMs included in the second mode). There are 10 DIMMs (DIMM_0 to DIMM_9), each including four DRAMs within the memory bank and thus having four consecutive columns in the code word. There are 8 rows in the code word, corresponding to the 8 bits stored in a given DRAM.

The embodiment of FIG. 9 includes the auxiliary check bits in column 0, the inner check bits in column 1, and the inner check bit duals in column 2 similar to the embodiment of FIG. 8. However, in this example, the auxiliary check bits are defined to be a rotational XOR of bits in the remaining columns. In other embodiments, the auxiliary check bits may be row check bits for this mode as well. By using a rotational XOR, additional information for identifying failed DRAMs and/or DIMMs may be provided. Generally, a rotational XOR covers bits along diagonals in the array of bits (columns $c_1$ through $c_{35}$), wrapping around to the bottom of the array when the diagonal crosses over the top (or vice versa). For example, in one embodiment, a nine bit rotational XOR is calculated by adding a false $9^{th}$ row to the array (all zeros) and computing the nine bits of rotational XOR over the diagonals. In such an embodiment, bit 9 of the rotational XOR covers the $8^{th}$ bit of column $c_1$, the $7^{th}$ bit of column $c_2$, etc. through the $1^{st}$ bit of column $c_8$, then wrapping around to the $9^{th}$ (zero) bit of column $c_9$, the $8^{th}$ bit if column $c_{10}$, etc. Bit 8 of the rotational XOR covers the next diagonal up (i.e. the $7^{th}$ bit of column $c_1$, the $6^{th}$ bit of column $c_2$, etc. through the $1^{st}$ bit of column $c_7$, then wrapping around to the $9^{th}$ (zero) bit of column $c_8$, the $8^{th}$ bit if column $c_9$, etc.). The remaining bits are computed in similar fashions over the remaining wrap-around diagonals. The auxiliary check bits are then generated by XORing the $9^{th}$ bit of the rotational XOR with each of the remaining 8 bits to generate a corresponding auxiliary check bit.

Additionally, DIMM_9 stores a set of outer check bits. The outer check bits cover the remaining DIMMs (DIMM_0 through DIMM_8). For example, in one embodiment, each outer check bit covers the bit in the same position within each other DIMM. That is, the outer check bit covers the bit in the same row as that outer check bit and in the same column within the DIMM. For example, for DIMM_0, the outer check bits in column $c_{36}$ cover the corresponding bits in column $c_0$; the outer check bits in column $c_{37}$ cover the corresponding bits in column $c_1$; the outer check bits in column $c_{38}$ cover the corresponding bits in column $c_2$; and the outer check bits in column $c_{39}$ cover the corresponding bits in column $c_3$. The outer check bits may be used to detect DIMM failures and to probabilistically reconstruct the data from the failed DIMM.

The remaining columns of the code word shown in FIG. 9 store the data (including metadata).

Turning next to FIG. 10, a table is shown illustrating the assignment of inner check bits to each DRAM (each column of the logical array illustrated in FIGS. 8 and 9) for the exemplary embodiment. The table lists the DRAM number (0 through 35, with two entries for DRAM 0 marked "0" and "!0"), the inner check bit vector[10:0] for that DRAM (where a binary one indicates that the corresponding inner check bit covers that bit and a binary zero indicates that the corresponding inner check bit does not cover that bit). The inner check bits listed in the table of FIG. 10 correspond to the bit in row 0 (and are also referred to as "headers" below). The inner check bit assignments for the other bits are generated as cyclic left shifts of the listed bit vector, based on the row number, as described above in the method for defining check bits section.

The inner check bit assignments shown in FIG. 10 were generated from matrices of the prime 11 (that is, P=11 in the method for defining check bits section described above). For example, a random search process over the eligible bit vectors may have been performed, testing the selected sets of vectors against rules 5, 6, and 8. Once a set of vectors was identified, the $12^{th}$ inner check bit shown in the table of FIG. 10 was added to ensure an odd weight for each vector, in order to meet rule 7. The $12^{th}$ inner check bit may also be referred to as the DED bit, since meeting rule 7 provides double bit error detection with the inner check bits. The DED bit is not cyclically shifted to produce the inner check bit assignments for rows 1 to 7, instead remaining as bit 11 of the inner check bits for each row. In other embodiments, odd weight inner check bit assignments may be made without adding the DED bit.

Figure 11:
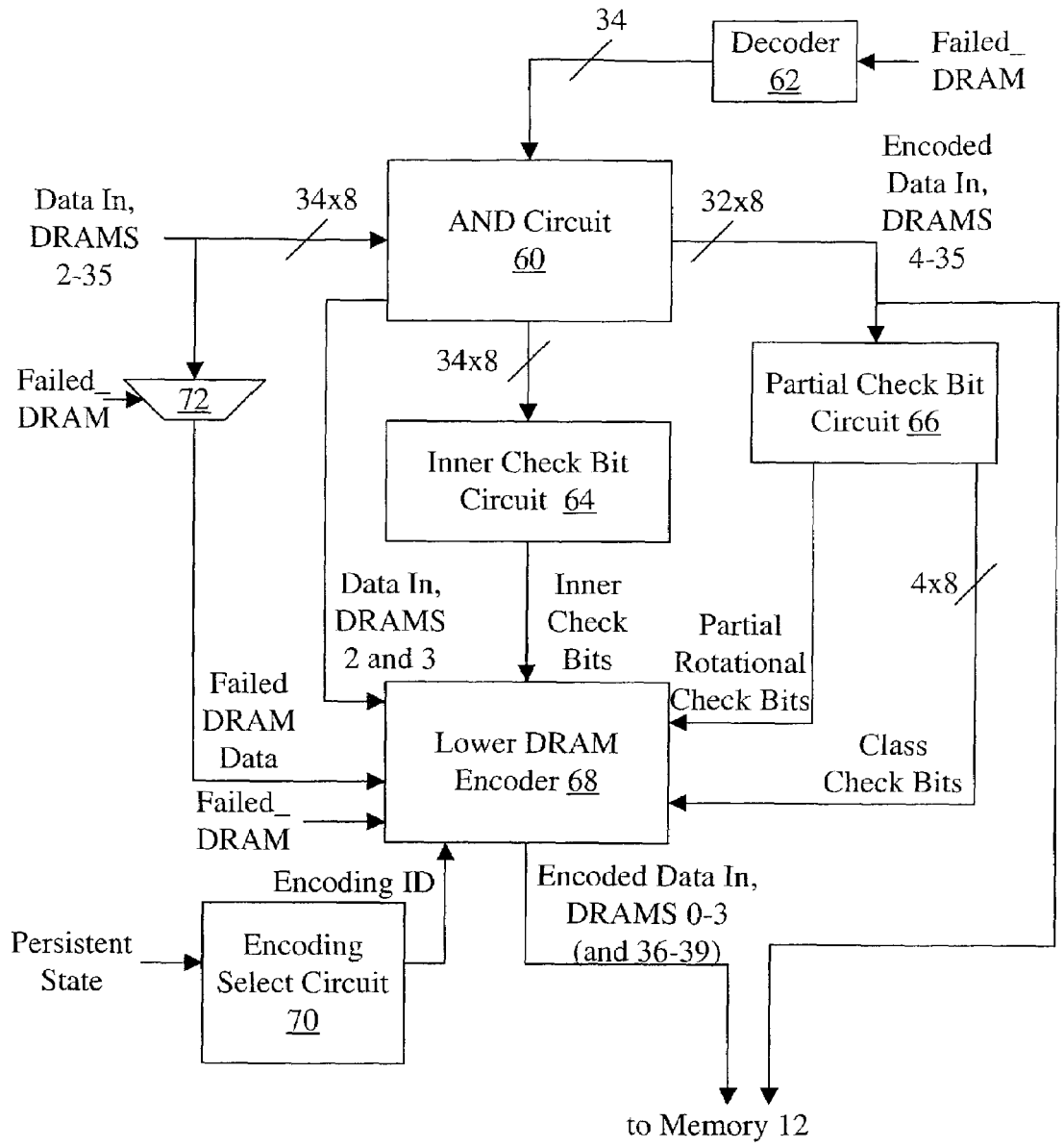
FIG. 11 is a block diagram of one embodiment of a check bit encoder circuit shown in FIG. 1.

Turning next to FIG. 11, a block diagram of one embodiment of the check bit encoder circuit 16 for the exemplary implementation is shown. Other embodiments are possible and contemplated. In the illustrated embodiment, the check bit encoder circuit 16 includes an AND circuit 60, a decoder 62, an inner check bit circuit 64, a partial check bit circuit 66, a lower DRAM encoder circuit 68, an encoding select circuit 70, and a mux 72. The decoder 62 is coupled to receive the failed_DRAM indication from the persistent state storage 20 and is coupled to provide a set of input signals to the AND circuit 60. The AND circuit 60 is further coupled to receive the input data, arranged as a logical array of columns 2–35 in the code word, for DRAMs 2–35 (with binary zeros in the Inner check bit duals positions of column 2). The AND circuit 60 is coupled to provide an encoded data output for columns 4–35 (DRAMs 4–35) to the partial check bit circuit 66 and as an output to be transmitted to the memory 12. The AND circuit 60 outputs the data for columns 2 and 3 (DRAMs 2 and 3) to the lower DRAM encoder circuit 68, and the data for columns 2–35 (DRAMs 2–35) to the inner check bit circuit 64, which generates a set of inner check bits and provides them to the lower DRAM encoder circuit 68. The partial check bit circuit 66 generates a set of partial rotational check bits and a set of class check bits, and outputs these bits to the lower DRAM encoder circuit 68. The mux 72 is coupled to receive the input data and to select data that would be stored in the failed DRAM (failed DRAM data), responsive to the failed_DRAM indication from the persistent state storage 20. The lower DRAM encoder circuit 68 is coupled to receive the failed DRAM data, the failed_DRAM indication, and an encoding identifier (ID) from the encoding select circuit 70, which receives the persistent state from the persistent state storage 20. The lower DRAM encoder circuit 68 outputs the encoded data to the memory 12 for columns 0–3 (DRAMS 0–3) and also for DRAMs 36–39 in embodiments employing DIMM failure detection.

The check bit encoder circuit 16 generates the code words for a cache line being written, based on the state of the cache line (one of the 5 states given above). Generally, the code words differ (between encoding #1 and encoding #2) in that one of the columns 2 through 35 may be zeros (if the corresponding DRAM has failed) and column 0 may be used to store the data formerly stored in the failed column (unless column 0 is the failed column). Additionally, in encoding #2, the inner check bits cover column zero.

The AND circuit 60 is provided to selectively zero one of columns 2–35 in response to the failed_DRAM indication. The AND circuit 60 may also unconditionally zero the inner check bit duals in column 2, or this zeroing may be performed elsewhere.

The decoder 62 decodes the failed DRAM indication and generates 34 signals (one for each of the columns 2–35). The AND circuit 60 logically ANDs the signal for each column with the bits of each column to generate the output bits for the inner check bit circuit 64 and the partial check bit circuit 66 (and the data from columns 2 and 3 provided to the lower DRAM encoder circuit 68). The actually circuitry in the AND circuit 60 may be any logic circuits, based on whether the signal output by the decoder 62 is a binary one or a binary zero for the failed column (and the opposite state for the other columns).

Since the data which would be written to the failed DRAM is moved to column 0, the mux 72 is used to select that data from the input data to the AND circuit 60 based on the failed_DRAM indication.

The inner check bit circuit 64 generates the inner check bits over columns 2–35, according to the inner check bits definition indicated in FIG. 10 for these columns. That is, the inner check bit circuit 64 may XOR each of the array bits covered by a given inner check bit to generate that check bit. As mentioned above, the bits in column 2 which are defined to be the inner check bit duals are set to zero for this calculation. The lower DRAM encoder circuit 68 may adjust the inner check bits generated by the inner check bit circuit 64 to account for setting the inner check bit duals, and also to account for data stored in column zero if encoding #2 is being used.

The partial check bit circuit 66 generates a set of partial check bits for use by the lower DRAM encoder 68. In particular, the partial check bit circuit 66 generates a set of partial rotational check bits over the columns 4–35, according to the rotational XOR definition for the auxiliary check bits. The partial rotational check bits may then be combined with the bits from columns 0–3 generated by the lower DRAM encoder circuit 68 according to the rotational XOR definition to generate the rotational XOR result (which may then be encoded as the auxiliary check bits by XORing the ninth bit of the rotational XOR result with each of the remaining rotational XOR result bits). In embodiments which do not implement the rotational XOR, the partial check bit circuit 66 may not generate the partial rotational check bits.

The partial check bit circuit 66 may also generate a set of class check bits over columns 4–35: As used herein, a class is the set of columns that correspond to the same position within each of the DIMMs. For example, class zero corresponds to the first DRAM in each DIMM (that is, DRAMs/columns 0, 4, 8, etc.). Similarly, class one corresponds to the second DRAM in each DIMM (that is, DRAMs/columns 1, 5, 9, etc.). The class check bits are the XOR of each bit in the class and in the same row, thus producing a 4×8 vector of bits. These bits may be used with the bits from columns 0–3 generated by the lower DRAM encoder circuit 68 to generate the outer check bits, in embodiments in which DIMM failure detection is implemented, and to generate the row check bits in embodiments in which DIMM failure detection is not implemented (by XORing the 4 vectors together and with the bits of columns 1–3).

The encoding select circuit 70 decodes the persistent state to determine which encoding (#1 or #2) is used for the code words being generated. The encoding select circuit provides the encoding ID to the lower DRAM encoder circuit 68.

The function of the lower DRAM encoder circuit 68 will next be described as a set of cases below. Case 0 is encoding #1, and the remaining cases are encoding #2 for various DRAM failures. In the following description, certain functions are referred to. The functions $f_0$, $f_1$, $f_2$, $g_0$, $g_1$, and $g_2$ are shown in FIG. 12. These functions illustrate a matrix followed by an input vector. Each row of the matrix specifies an output bit as an XOR of input bits indicated by binary ones in the corresponding positions within the row. The functions $f_0$ and $g_0$ generate the inner check bit duals stored in column 2 and adjust the inner check bits stored in column 1 to reflect the inner check bit duals, respectively. Functions $f_1$ and $g_1$ set each of the inner check bits to zero when column 1 or column 37 has failed, respectively. Functions $f_2$ and $g_2$ generate the inner check bit duals and adjust the inner check bits stored in column 1 when column 2 or column 38 has failed, respectively. Also, the function "parity0" is a check bit generation using the inner check bit definition for column zero (see FIG. 10), the function "parity2" is a check bit generation using the inner check bit definition for column two (see FIG. 10), and the function "parity3" is a check bit generation using the inner check bit definition for column three (see FIG. 10). "Inner check bits$_{x,y}$" are the inner check bits generated by the inner check bit circuit 64. Data_X is the data in column X prior to ANDing by the AND circuit 60. When a bit range is not used below, the entirety of the value is specified.

Case 0: Encoding #1
Column 1=Inner Check Bits$_{0\ 7}$ XOR $g_0$(Inner Check Bits$_{8\ 11}$)
Column 2$_{0\ 3}$=$f_0$(Inner Check Bits$_{8\ 11}$)
Column 2$_{4\ 7}$=Data_2$_{4\ 7}$
Column 3=Data_3
Column 0=auxiliary check bits
Case 1: DRAM 0 has failed (Set Aux$_{0\ 7}$=0)
Update$_{0\ 11}$=Parity0(Aux)
Column 0=Aux
Column 1=Inner Check Bits$_{0\ 7}$ XOR $g_0$(Inner Check Bits$_{8\ 11}$) XOR Update$_{0\ 7}$ XOR $g_0$(Update$_{8\ 11}$)
Column 2$_{0\ 3}$=$f_0$(Inner Check Bits$_{8\ 11}$) XOR $f_0$(Update$_{8\ 11}$)
Column 2$_{4\ 7}$=Data_2$_{4\ 7}$
Column 3=Data_3

It is noted that, since Aux is set to zero, Update$_{0\ 11}$ is zero and the functions taking Update as an input are also zero. These terms may be eliminated in embodiments which do not implement DIMM failure detection. Aux is set differently in case 6 below.

Case 2: DRAM 1 has failed (Set $Aux_{0\_7}=0$)
$Update_{0\_7}=Aux$
$Update_{8\_11}=0$
Column $0=g_1$(Inner Check Bits) XOR $g_1$(Update)
Column 1=Aux
Column $2_{0\_3}=f_1$(Inner Check Bits) XOR $f_1$(Update)
Column $2_{4\_7}=Data\_2_{4\_7}$
Column 3=Data_3

It is noted that, since Aux is set to zero, $Update_{0\_11}$ is zero and the functions taking Update as an input are also zero. These terms may be eliminated in embodiments which do not implement DIMM failure detection. Aux is set differently in case 6 below.

Case 3: DRAM 2 has failed (Set $Aux_{0\_7}=0$
$New_{0\_3}=0$
$New_{4\_7}=Data\_2_{4\_7}$
Update=parity0(New) XOR parity2($Aux_{0\_7}$)
Column $0_{0\_3}=f_2$(Inner Check $Bits_{8\_11}$) XOR $f_2$($Update_{8\_11}$)
Column $0_{4\_7}=Data\_2_{4\_7}$
Column 1=Inner Check $Bits_{0\_7}$ XOR $g_2$(Inner Check $Bits_{8\_11}$) XOR $Update_{0\_7}$ XOR $g_2$($Update_{8\_11}$)
Column 2=Aux
Column 3=Data_3

Case 4: DRAM 3 has failed (Set $Aux_{0\_7}=0$)
Update=parity0(Data_3) XOR parity3($Aux_{0\_7}$)
Column 0=Data_@3
Column 1=Inner Check $Bits_{0\_7}$ XOR go(Inner Check $Bits_{8\_11}$) XOR $Update_{0\_7}$ XOR go($Update_{8\_11}$)
Column $2_{0\_3}=f_0$(Inner Check $Bits_{8\_11}$) XOR $f_0$($Update_{8\_11}$)
Column $2_{4\_7}=Data\_2_{4\_7}$
Column 3=Aux Case 5: One of DRAMs 4–35 has failed (Failed DRAM=X)
Update=parity0(Data_X)
Column 0=Data_X
Column 1=Inner Check $Bits_{0\_7}$ XOR $g_0$(Inner Check $Bits_{8\_11}$) XOR $Update_{0\_7}$ XOR $g_0$($Update_{8\_11}$)
Column $2_{0\_3}=f_0$(Inner Check $Bits_{8\_11}$) XOR $f_0$($Update_{8\_11}$)
Column $2_{4\_7}=Data\_2_{4\_7}$
Column 3=Data_3

Case 6: One of DRAMs 36–39 has failed (Failed DRAM=X)

Since these columns are computed over columns 0–39, one of these columns is zeroed indirectly. That is, one of the other columns is set such that the failed column evaluates to zero, as follows:
Y=Xmod4
$Aux_{0\_7}$=XOR over the class Y DRAMs
Compute one of cases 1–4 above for DRAM Y with the above setting of Aux There are two inner check bit assignments for column 0 in FIG. 10 (0 and !0). Neither is used in encoding #1, as mentioned above. The assignments labeled "0" are used in encoding #2 unless the failed DRAM is DRAM 1 or 37, in which case the assignments labeled "!0" are used. The assignments labeled "0" have the DED bit set, which cancels the DED bit in the assignments for DRAM 2, if DRAM 2 fails. The assignments labeled "!0" have the DED bit clear, to allow for inversion when combined with the assignments for DRAM 2 to generate function 1.

It is noted that, in one embodiment, the functions $f_1$(Inner Check $Bits_{0\_11}$) and $g_1$(Inner Check $Bits_{0\_11}$) may be computed in parallel from the AND circuit 60 output by building additional XOR trees that accomplish inner check bit generation and the function computation. Similarly, other functions or combinations in the above cases may be computed directly from the AND circuit 60 output, as desired.

Figure 13:
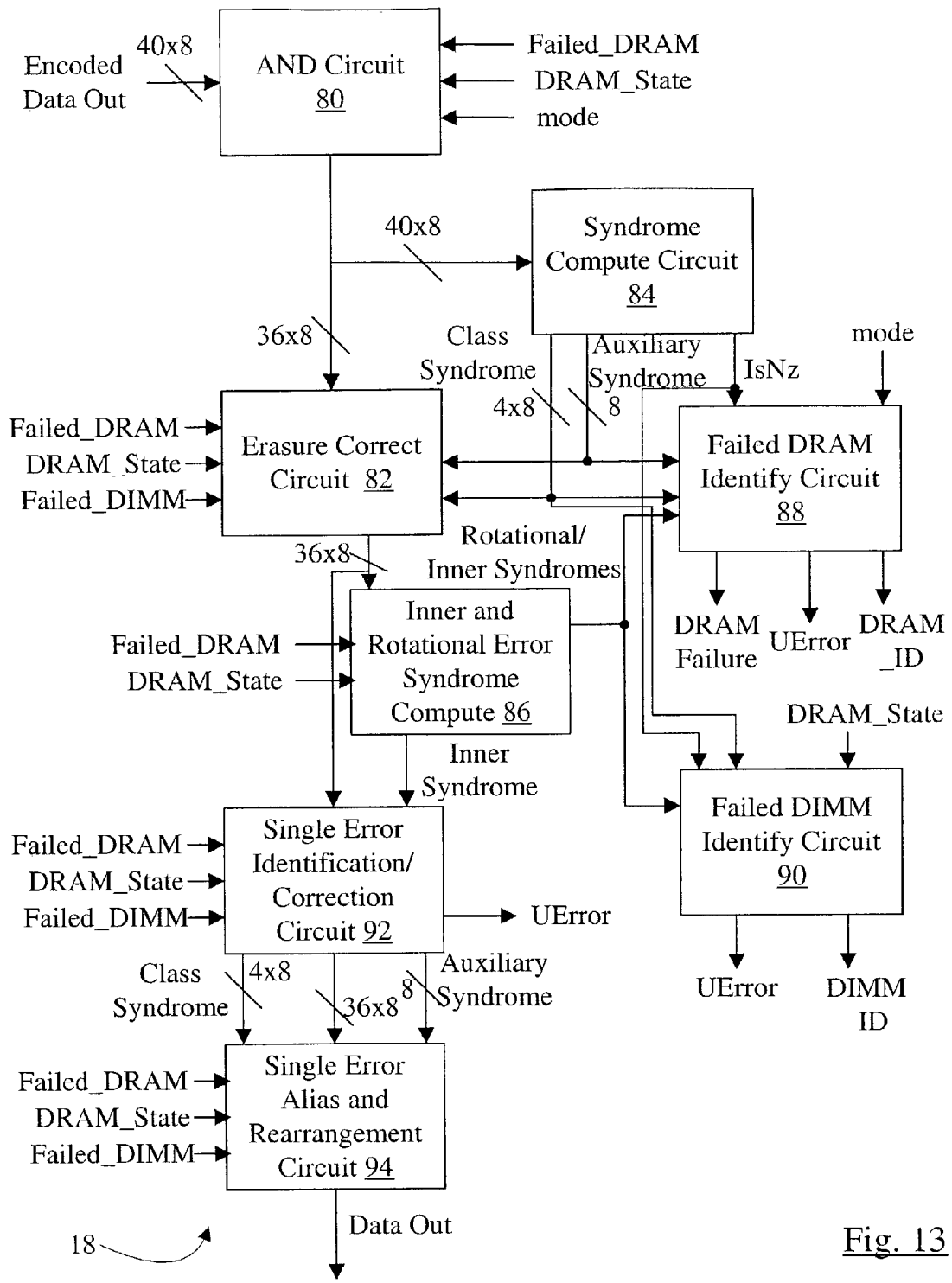
FIG. 13 is a block diagram of one embodiment of an ECC circuit shown in FIG. 1.

Turning next to FIG. 13, a block diagram of one embodiment of the FCC circuit 18 for the exemplary implementation is shown. Other embodiments are possible and contemplated. In the embodiment of FIG. 13, the FCC circuit 18 includes an AND circuit 80, an erasure correct circuit 82, a syndrome compute circuit 84, an inner and rotational error syndrome compute circuit 86, a failed DRAM identify circuit 88, a failed DIMM identify circuit 90, a single error identification/correction circuit 92, and a single error alias and rearrangement circuit 94. Several circuits are shown receiving a DRAM_state. The DRAM_state may be one of the five states described above (State_1, State_1R, etc.). The states may be represented in any manner. For example, 3 bits may be used, with one bit indicating encoding #1 or #2, another bit indicating whether or not there is a failed DRAM, and another bit indicating whether or not there is a failed DIMM. Circuitry for decoding the DRAM_state from the persistent state storage 20 is not shown. Additionally, the mode received by the AND circuit 80 and the failed DRAM identify circuit 88 may be an indication of the first mode (no DIMM failure detection) or the second mode (DIMM failure detection).

The AND circuit 80 receives the code word from the memory 12 (encoded data out), as well as the failed_DRAM indication, the DRAM_state, and the mode. The AND circuit 80 selectively zeros one of columns 0–39 (or none if no DRAM failure is indicated) dependent on the failed_DRAM indication and the DRAM_state. More particularly, the column identified by the failed DRAM indication is zeroed if the DRAM_state indicates that the line is in encoding #2. Additionally, the AND circuit 80 may zero columns 36–39 if in the first mode.

The AND circuit 80 outputs the 40×8 array to the syndrome compute circuit 84, and the 36×8 array comprising columns 0–35 of the code word to the erasure correct circuit 82. The syndrome compute circuit 84 computes two syndromes, a class syndrome and an auxiliary syndrome. Additionally, a set of IsNz signals are generated. The class syndrome is provided to the erasure correct circuit 82, the failed DRAM identify circuit 88, and the failed DIMM identify circuit 90. The auxiliary syndrome is provided to the failed DRAM identify circuit 88 and the erasure correct circuit 82. The IsNz signals are provided to the failed DRAM identify circuit 88 and the failed DIMM identify circuit 90.

The class syndrome computed by the syndrome compute circuit 84 is a set of syndromes calculated according to the class that the DRAMs belong to. That is, class 0 includes DRAM 0, 4, 8, etc. and the first column of the class syndrome is the syndrome for class 0, calculated by XORing corresponding row bits from each DRAM in that class. The auxiliary syndrome is the vector formed by exclusive ORing each bit in a given row to produce a given bit of the vector. The auxiliary syndrome may be generated as the XOR of the class syndromes (on a row basis). There are 4 IsNz signals corresponding to the four class syndromes. Each signal indicates, when asserted that at least one bit in that class syndrome is non-zero.

The erasure correct circuit 82 is configured to correct previously identified persistent errors (DRAM failures or DIMM failures) by reconstructing the data from the failed DRAM or DIMM. An example is shown in more detail in FIG. 14 and is described below. The erasure correct circuit 82 supplies columns 0–35 of the code word, with the reconstructed data, to the inner and rotational error syndrome compute circuit 86 and the single error identification/correction circuit 92. The erasure correct circuit 82 is coupled to receive the failed DRAM indication, the DRAM_state, and the failed DIMM indication.

The inner and rotational error syndrome compute circuit 86 is further coupled to receive the failed_DRAM indication and the DRAM_state, and generates an inner syndrome provided to the single error identification/correction circuit 92, the failed DRAM identify circuit 88, and the failed DIMM identify circuit 90. Additionally, the inner and rotational error syndrome compute circuit 86 generates a rotational error syndrome for the failed DRAM identify circuit 88 and the failed DIMM identify circuit 90.

In encoding #1, the inner syndrome is calculated over columns 1–35, using the inner check bit definitions shown in FIG. 10. In encoding #2, if the failed DRAM is DRAM 1 or 37, the inner syndrome is calculated over columns 0–35, using the inner check bit definition "!0" for column 0, as shown in FIG. 10. In encoding #2, if the failed DRAM is other than 1 or 37, the inner syndrome is calculated over columns 0–35, using the inner check bit definition "0" for column 0, as shown in FIG. 10. The rotational error syndrome is calculated by XORing the rotational sets of bits used to calculate the rotational check bits with the corresponding rotational check bits from column 0 (assuming the $9^{th}$ bit is zero). It is noted that, similar to the above discussion for generating the inner check bits, in some embodiments multiple sets of XOR trees may be used to generate the inner syndrome dependent on which of the functions from FIG. 12 were used in generating the inner check bits.

The single error identification/correction circuit 92 is further coupled to receive the failed_DRAM indication, the DRAM_state, and the failed_DIMM indication. Generally, the single error identification/correction circuit 92 is configured to correct a single bit error that existed in the data prior to erasure correction. The single error identification/correction circuit 92 outputs the 36×8 array with the single bit error corrected to the single error alias and rearrangement circuit 94. Additionally, the single error identification/correction circuit 92 generates another class syndrome and auxiliary syndrome which identify the projection of the single bit error to the reconstructed data. The auxiliary syndrome and class syndrome are provided to the single error alias and rearrangement circuit 94.

Figure 15:
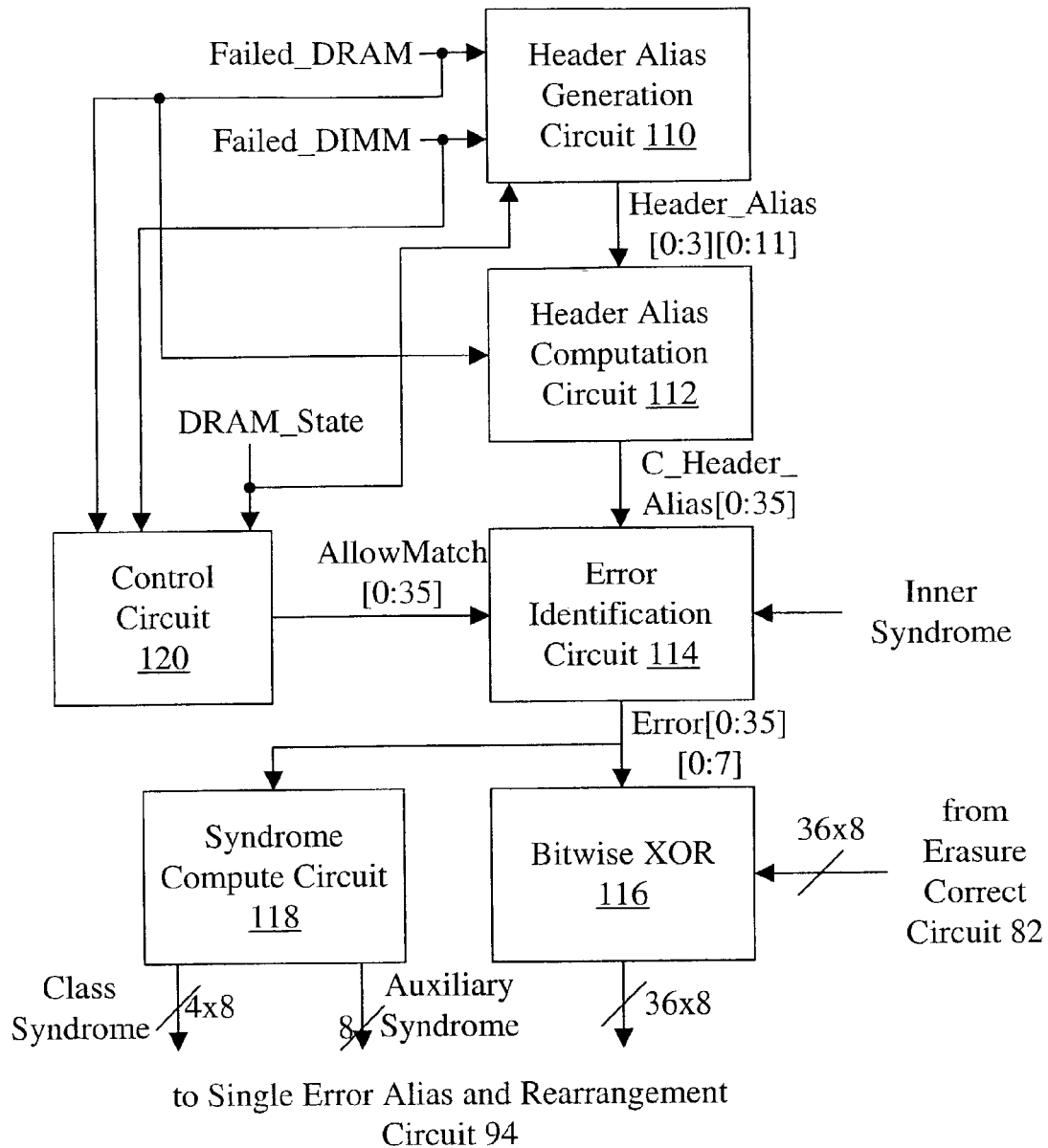
FIG. 15 is a block diagram of one embodiment of an single error identification/correction circuit shown in FIG. 13.

The single error identification/correction circuit 92 may also generate an uncorrectable error signal (UError) if an uncorrectable error is detected. Additional details of one embodiment of the single error identification/correction circuit are shown in FIG. 15 and described in more detail below.

Figure 16:
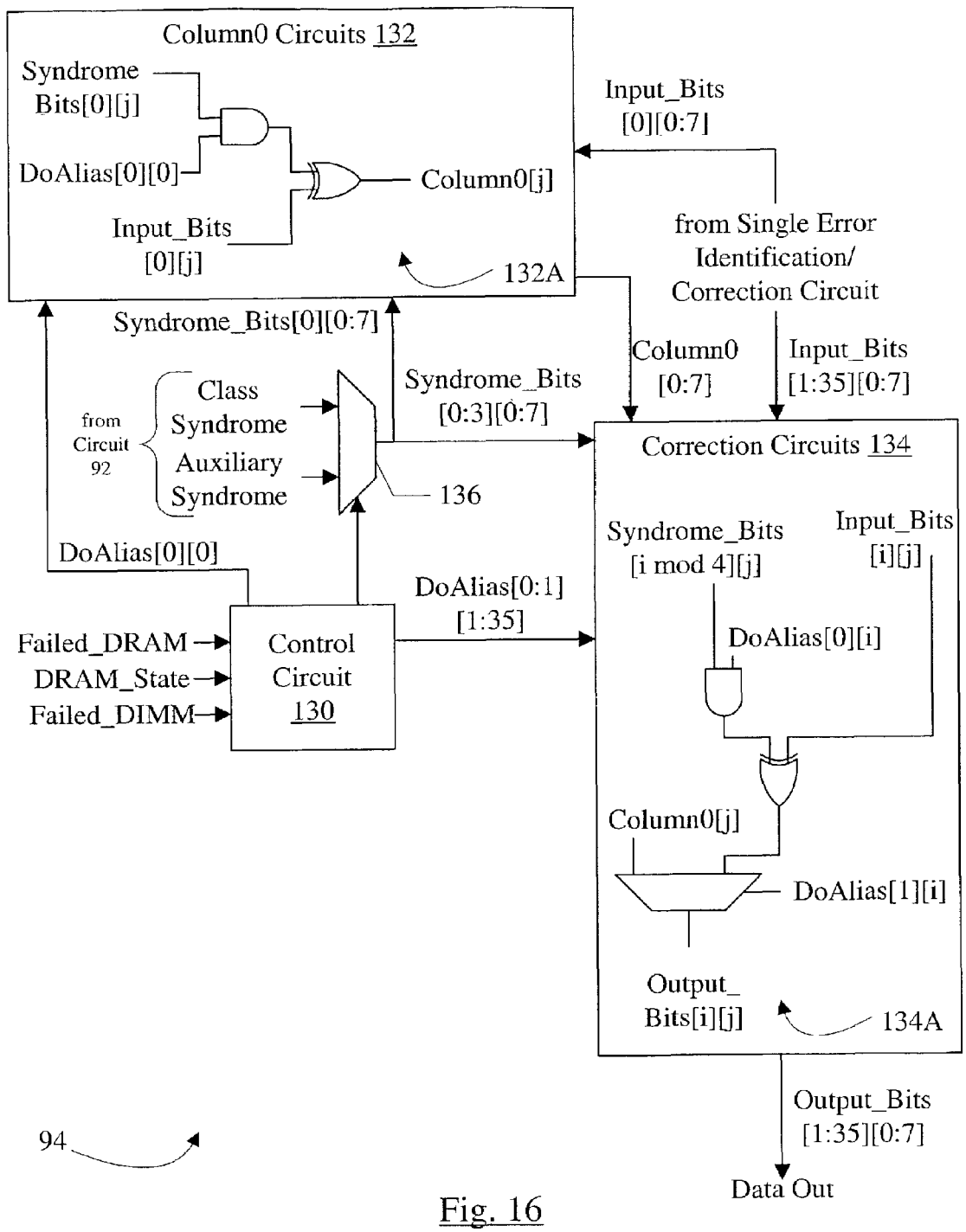
FIG. 16 is a block diagram of one embodiment of a single error alias and rearrangement circuit shown in FIG. 13.

The single error alias and rearrangement circuit 94 is further coupled to receive the failed_DRAM indication, the DRAM_state, and the failed_DIMM indication and generates the data out (output from the memory controller 10 to the requester of the data and possibly fed back to the check bit encoder circuit 16 through the mux 24). The single error alias and rearrangement circuit 94 corrects the projection of the single bit error and also rearranges the data stored in column 0 in encoding #2 back to its original place. Additional details of one embodiment of the single error alias and rearrangement circuit 94 are shown in FIG. 16 and described below.

Figure 17:
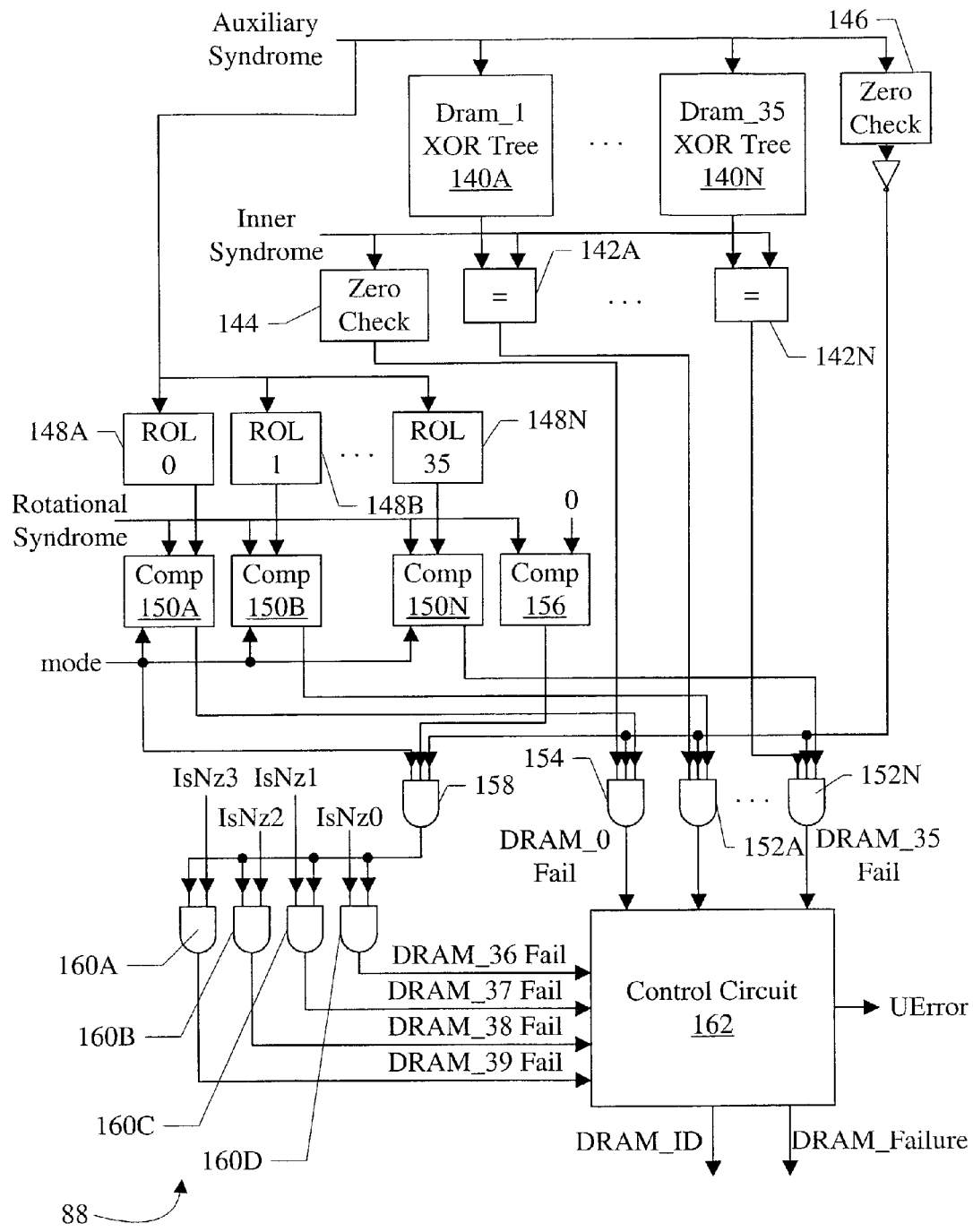
FIG. 17 is a block diagram of one embodiment of a failed DRAM identify circuit shown in FIG. 13.

The failed DRAM identify circuit 88 detects a failed DRAM, outputting a DRAM_ID to the persistent state storage 20, which may store a failed_DRAM indication corresponding to the DRAM_ID. Additionally, the failed DRAM identify circuit 88 may output a DRAM failure signal which may be used by the data remap control circuit 22 to initiate remapping (in one embodiment) and a UError signal indicating an uncorrectable error. One embodiment of the failed DRAM identify circuit 88 is shown in FIG. 17 and described below.

Figure 18:
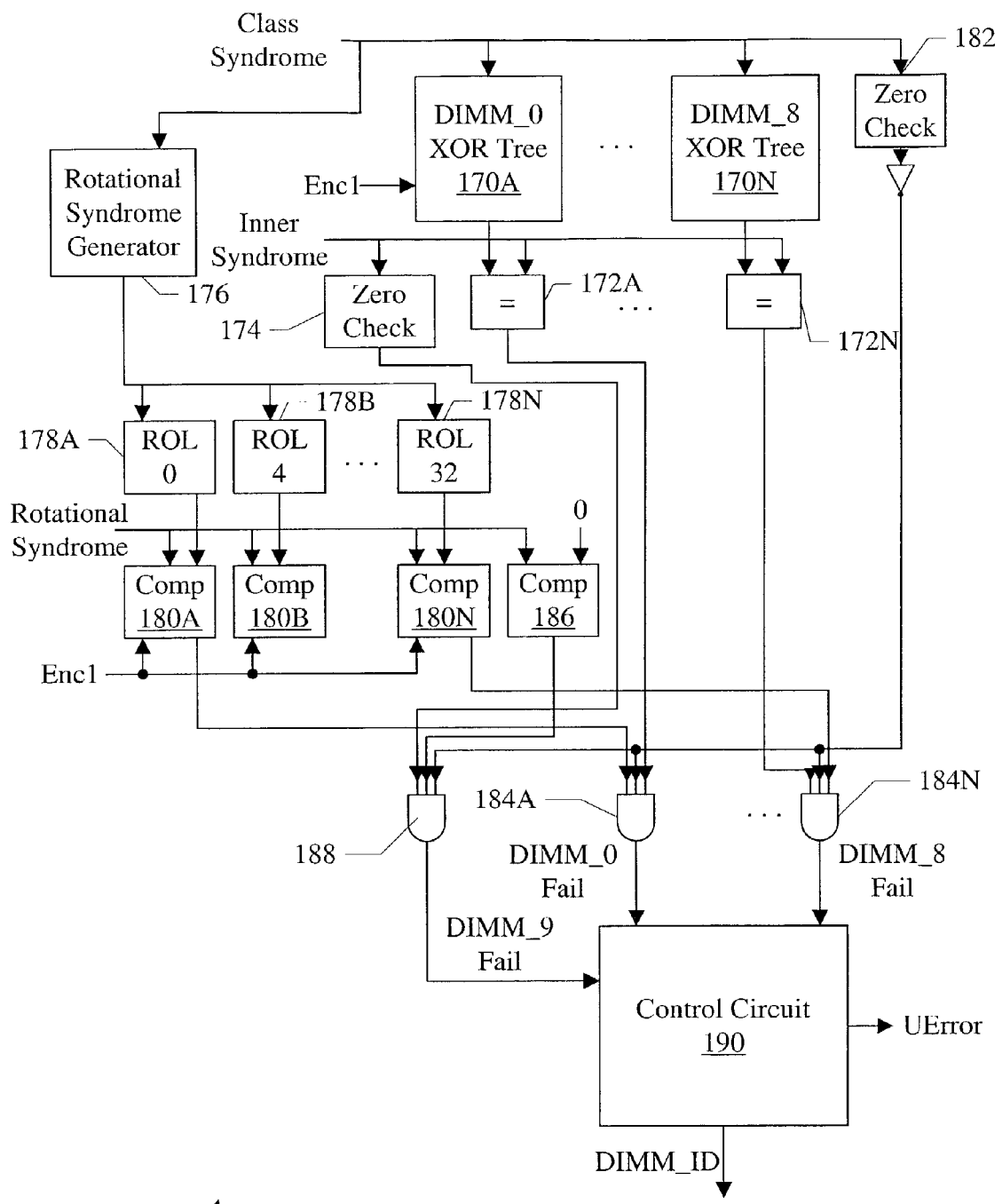
FIG. 18 is a block diagram of one embodiment of a failed DIMM identify circuit shown in FIG. 13.

The failed DIMM identify circuit 90 is further coupled to receive the DRAM_state and detects a failed DIMM, outputting a DIMM_ID to the persistent state storage 20, which may store a failed_DIMM indication corresponding to the DIMM_ID. Additionally, the failed DIMM identify circuit 90 may output a UError signal indicating an uncorrectable error. One embodiment of the failed DIMM identify circuit 90 is shown in FIG. 18 and described below.

Figure 14:
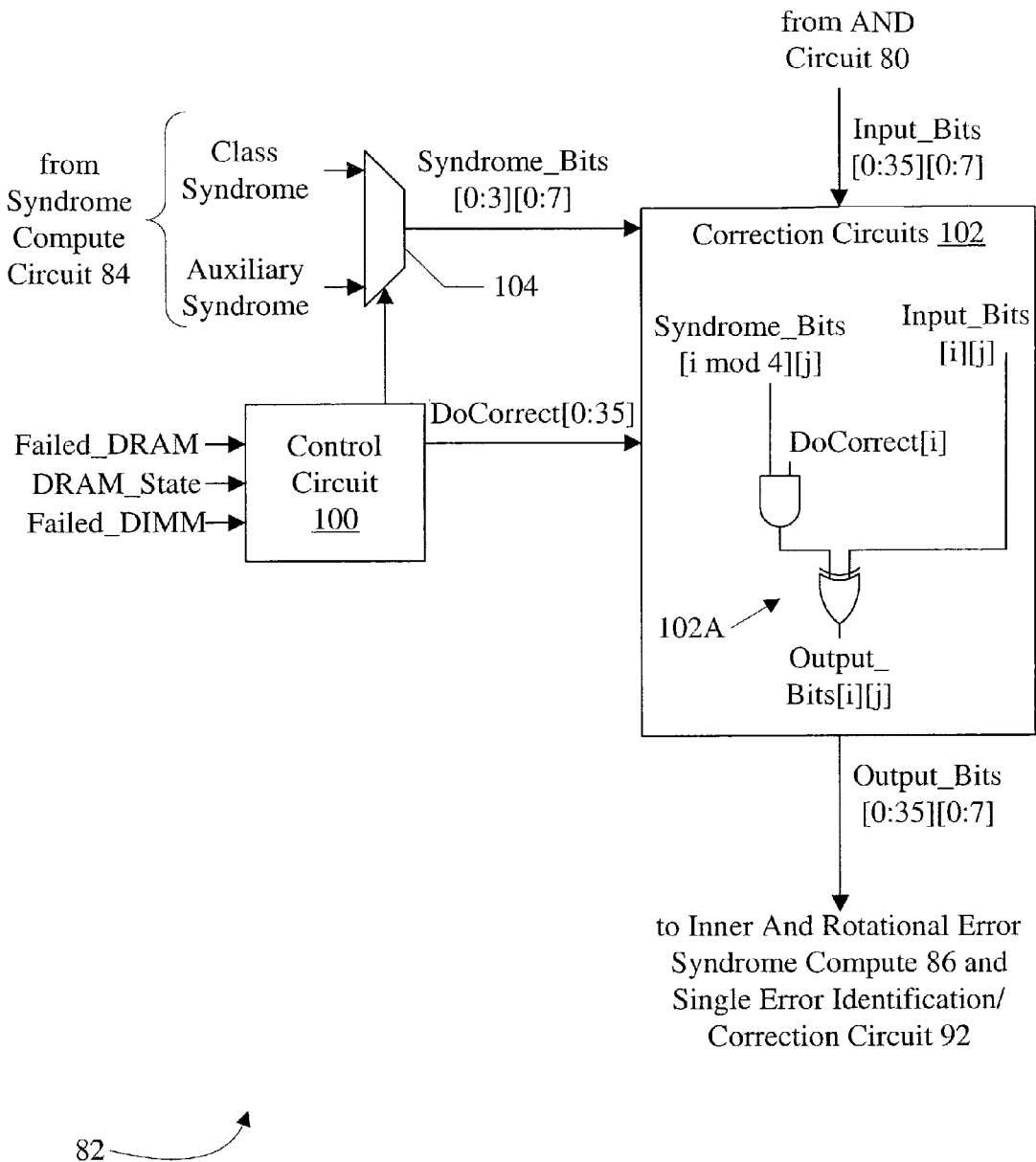
FIG. 14 is a block diagram illustrating one embodiment of an erasure correction circuit shown in FIG. 13.

Turning next to FIG. 14, a block diagram of one embodiment of the erasure correction circuit 82 is shown for the exemplary implementation. Other embodiments are possible and contemplated. In the embodiment of FIG. 14, the erasure correction circuit 82 includes a control circuit 100, a set of correction circuits 102, and a mux 104. The control circuit 100 is coupled to receive the failed_DRAM indication, the DRAM_state, and the failed_DIMM indication, and provides selection control to the mux 104 and a set of DoCorrect signals (one per column) to the correction circuits 102. The mux 104 is coupled to receive the class syndrome and the auxiliary syndrome from the syndrome compute circuit 84 and is coupled to provide a set of syndrome bits to the correction circuits 102. The correction circuits 102 are coupled to receive the input bits from the AND circuit 80 and to generate output bits to the inner and rotational error syndrome compute circuit 86 and the single error identification/correction circuit 92.

The mux 104 is configured to select between the class syndrome and the auxiliary syndrome (repeated four times to form a 4×8 array) depending on whether or not a DIMM failure has been detected. That is, if a DIMM failure has been detected (State_1D or State_2RD of the DRAM_state), the control circuit 100 may select the class syndrome through the mux 104 and otherwise may select the auxiliary syndrome through the mux 104.

The control circuit 100 is configured to generate the DoCorrect signals as well. As mentioned above, one DoCorrect signal per column is generated. An asserted DoCorrect signal indicates that a correction (a reconstruction of the data) is to be performed in the corresponding column. The DoCorrect signals are generated as follows: If the DRAM_state is State_1, no DRAM or DIMM failure has been detected and the DoCorrect signals are deasserted. If the DRAM_State is State_1R, a DRAM failure has been detected and this code word has not been recoded yet, so the DoCorrect signal for the column indicated by the failed_DRAM indication is asserted (and other DoCorrect signals are deasserted). If the failed DRAM is one of DRAMs 36–39, no DoCorrect signal is asserted. If the DRAM_State is State_2R, a DRAM failure has been detected and this code word has been recoded (to store the failed DRAM data in column 0) and thus the data does not require reconstruction. Therefore, the DoCorrect signals are deasserted. If the DRAM_State is State_1D or State_2RD, a DIMM failure has been detected. The DoCorrect signals for the DRAMs within the failed DIMM indicated by the failed_DIMM indication are asserted (and the other DoCorrect signals are deasserted).

An exemplary correction circuit 102A corresponding to input_bits[i][j], wherein 0<i<35 and 0<j<7 is shown in FIG. 14. Similar circuits are included for each i and each j. The circuit 102A receives the syndrome bit for its class (i mod 4) and its row number (j), the DoCorrect signal for its column number, and the input bit for its row and column. If the DoCorrect signal is asserted and the syndrome bit is asserted, the input bit is inverted. Otherwise, the input bit is passed through unmodified. While an AND gate and an XOR gate are shown in FIG. 14, other embodiments may employ other gates depending on the asserted definitions of the syndrome bits and DoCorrect signals (e.g. binary one or binary zero may be defined as asserted) and any Boolean equivalents, as desired.

Since the syndrome bits are the XOR of each bit in a given row of the array (including the auxiliary check bits), the syndrome bits indicate which bits in the failed column are to be flipped to reconstruct the data in the failed column. In effect, the correction circuit 102A may accomplish the XORing of each other column except for the failed column by XORing the failed column twice (once to generate the auxiliary syndrome, and again in the correction circuit 102A in order to regenerate the correct contents of the failed column). Similarly, since the class syndrome bits are the XOR of each bit in a given row of the array and in the same class (including the auxiliary check bits and the outer check bits), the class syndrome bits indicate which bits in the failed columns corresponding to the failed DIMM are to be flipped to reconstruct the data in those failed columns, on a class basis.

Turning next to FIG. 15, a block diagram of one embodiment of the single error identification/correction circuit 92 is shown for the exemplary implementation. Other embodiments are possible and contemplated. In the embodiment of FIG. 15, the single error identification/correction circuit 92 includes a header alias generation circuit 110, a header alias computation circuit 112, an error identification circuit 114, a bitwise XOR circuit 116, a syndrome compute circuit 118, and a control circuit 120. The header alias generation circuit 110 is coupled to receive the failed_DRAM and failed_DIMM indications, and the DRAM_state, and is configured to generate a set of four header aliases (Header_Alias in FIG. 15) for the header alias computation circuit 112, which generates a set of computed header aliases (C_Header_Alias in FIG. 15) for the error identification circuit 114, which is further coupled to receive the inner syndrome from the inner and rotational error syndrome compute circuit 86 and a set of AllowMatch signals from the control circuit 120. The control circuit 120 generates the AllowMatch signals responsive to the failed_DRAM indication, the failed_DIMM indication, and the DRAM_state. The error identification circuit 114 generates an Error array and provides the array to the syndrome compute circuit 118 and the bitwise XOR circuit 116. The bitwise XOR circuit 116 receives the 36×8 array of data from erasure correct circuit 82 (output_bits in FIG. 14) and generates a 36×8 array of data for the single error alias and rearrangement circuit 94. The syndrome compute circuit 118 computes a class syndrome and an auxiliary syndrome for the single error alias and rearrangement circuit 94. The header alias computation circuit is coupled to receive the failed_DRAM indication.

Generally, the single error identification/correction circuit 92 is configured to detect and correct a single bit error which existed in the code word prior to data reconstruction by the erasure correct circuit 82. Since the operation of the erasure correct circuit 82 may have created a projection of the single bit error into the reconstructed data, and since the resulting syndrome would be the XOR of the single bit error and its projection, a set of header aliases are generated based on the failed_DRAM or failed_DIMM. A header is the definition of the inner check bits for row 0 (e.g. it is shown for this implementation in FIG. 10 for each column).

Particularly, the header alias generation circuit 10 outputs a set of header aliases. These header aliases may generally correspond to the failed column (or columns for a DIMM failure). The header aliases are generated on a class basis, to provide for DIMM failure, but may be the same alias if a DIMM failure has not been detected. Particularly, the header aliases may be generated as follows: If the DRAM_state is State_1, no DRAM or DIMM failures have been detected and the header aliases are zero. If the DRAM_state is State_1R, a DRAM failure has been identified and the current code word is in encoding #1. The header corresponding to the failed DRAM is output, repeated four times, as the four header aliases. If the DRAM_State is State 1_D, a DIMM failure has been detected and the current code word is in encoding #1. The four headers for the DRAMs on the failed DIMM are generated, except that if DIMM_0 has failed, the column zero header is zero (since column 0 is not included in the inner check bits in encoding #1). If the DRAM_state is State_2R, there is a DRAM failure but no DIMM failure and the current code word is in encoding #2. Since there is no reconstruction of the data, there is no single bit error alias and the four header aliases are set to zero. If the DRAM_state is State_2RD, there is a previous DRAM failure, a DIMM failure and the current code word is in encoding #2. Four headers for the DRAMs of the failed DIMM are generated. If the failed DIMM is DIMM_0 and the failed DRAM is not DRAM 1 or 37, header 0 is used for class 0. If the failed DIMM is DIMM_0 and the failed DRAM is either DRAM 1 or 37, then header !0 is used for class 0. Otherwise, the headers as listed in the table of FIG. 10 are used.

In one embodiment, the header alias generation circuit 110 may employ a pair of ROMs. The first ROM may output a header based on the failed_DRAM indication and whether or not the encoding is encoding #1. If there is no failed DRAM, the failed DRAM is 0 or 36–39, or the encoding is encoding #2, the first ROM outputs zero. Otherwise, the first ROM outputs the header corresponding to the failed_DRAM indication. A second ROM outputs 4 headers (one for each class) based on the failed_DRAM indication, the failed_DIMM indication, and whether or not the encoding is encoding #1. If there is no failed DIMM or the failed DIMM is DIMM_9, the second ROM outputs zero. Otherwise, the second ROM outputs headers as defined for State_1D or State_2RD as described above. A set of muxes is provided, each of which receive the output of the first ROM and one of the headers from the second ROM. The muxes select the output of the first ROM unless the DRAM_state is State_1D or State_2RD, in which case the output of the second ROM is selected. Other embodiments may use other ROMs, hard coded circuitry, or a combination thereof as desired.

The header alias computation circuit 112 receives the header aliases from the header alias generation circuit and generates a header alias for each column 0–35 of the array. Logically, the computed header aliases are the XOR of the header alias corresponding to that column (Header_Alias [column mod 4][0:11]) and the header corresponding to that column (from FIG. 10, where the header for column zero is selected as "0" unless the failed_DRAM indication indicates DRAM 1 or DRAM 37, in which case the header "!0" is selected). While this is logically an XOR, since the headers corresponding to the column are fixed, the header alias computation circuit 112 may invert bits of the input to generate the computed header alias, with the exception of column 0 which may include additional logic to account for the bit differences between header "0" and header "!0".

The error identification circuit 114 receives the computed header aliases (C_Header_Alias). For each row in the array, the error identification circuit cyclically left shifts the least significant 11 bits (leaving the DED bit in place as the 12$^{th}$ bit). The resulting values are then compared to the inner syndrome. For example, the inner syndrome and the result may be XORed. The result is qualified with the AllowMatch signal for that column, received by the error identification circuit 114. That is, the comparison indicates a match if the AllowMatch signal is asserted and the XOR results in zero, and indicates a non-match otherwise. The result is recorded as the bit for the corresponding row and column in the Error[0:35][0:7] output matrix. The output matrix may have at most one error indicated. In particular, the bitwise XOR circuit 116 receives the error output matrix and bitwise XORs the matrix with the data received from the erasure correct circuit 82 to generate the output data (36×8) to the single error alias and rearrangement circuit 94.

The syndrome compute circuit 118 also receives the error output matrix and computes a class syndrome and an auxiliary syndrome, similar to those computed by the syndrome compute circuit 84 in FIG. 13 but generated over the error matrix. These syndromes indicate the row position of the single bit error (auxiliary syndrome) and the position within a DIMM of the single bit error (class syndrome) and thus locate the projection of the single bit error into the reconstructed column or DIMM, respectively. The auxiliary syndrome and class syndrome are passed to the single error alias and rearrangement circuit 94. It is noted that, while these syndromes are logically XORs of bits in the error output matrix, at most one bit in the error output matrix is set. Therefore, the syndrome compute circuit 118 may implement logical ORs of the bits to compute the auxiliary syndrome. Any circuitry that accomplishes a logical OR of the bits may be used. In one implementation, the class syndrome may be computed and then the auxiliary syndrome may be computed as the logical OR (on a row basis) of the columns of the class syndrome.

The control circuit 120 generates the AllowCorrect signals based on the DRAM_state, the failed_DRAM indication, and the failed_DIMM indication. Generally, the control circuit 120 allows the correction in any column except for a column that is the failed DRAM column or part of a failed DIMM (since these columns were reconstructed and may have a projection of the single bit error to these columns). Particularly, the control circuit 120 may generate the AllowCorrect signals as follows: If the DRAM_state is State_1, there was no data reconstruction. Each of the AllowCorrect signals is asserted except for AllowCorrect[0], since column 0 is not covered by the inner check bits in encoding #1. If the DRAM_state is State_1R, there is a failed DRAM but the code word is still in encoding #1. The AllowCorrect signals are asserted, except for AllowCorrect[0] and the AllowCorrect signal corresponding to the failed DRAM. If the DRAM_state is State_2R, there is a failed DRAM and the code word is in encoding #2. The AllowCorrect signals are asserted (including AllowCorrect[0]), except for the column indicated by the failed_DRAM indication. If the DRAM_state is State_1D or State_2RD, there is a DIMM failure. The AllowCorrect signals are asserted, except for the columns corresponding to the failed DIMM.

As shown in FIG. 13, the single error identification/correction circuit 92 may also assert a UError signal if an uncorrectable error is detected. Particularly, in this implementation, the UError signal may be asserted if the inner syndrome is non-zero (indicating a single bit error exists) but the error output matrix is zero (indicating that the error was not located).

Turing next to FIG. 16, a block diagram of one embodiment of the single error alias and rearrangement circuit 94 is shown for the exemplary implementation. Other embodiments are possible and contemplated. In the embodiment of FIG. 16, the single error alias and rearrangement circuit 94 includes a control circuit 130, a set of column0 circuits 132, a set of correction circuits 134, and a mux 136. The control circuit 130 is coupled to receive the failed_DRAM indication, the DRAM_state, and the failed_DIMM indication and is configured to generate a select control for the mux 136, a DoAlias[0][0] signal for the column0 circuits 132, and a set of DoAlias[0:1][1:35] signals for the correction circuits 134. The mux 136 is coupled to receive the class syndrome and the auxiliary syndrome from the single error identification/correction circuit 92 and is configured to generate a 4×8 set of Syndrome_Bits[0:3][0:7] for the column0 circuits and the correction circuits 134. The column0 circuits 132 receive the input bits for column 0 from the single error identification/correction circuit 92, and the remaining input bits are provided to the correction circuits 134. The column0 circuits 132 output a set of column 0 bits (Column0[0:7]) to the correction circuits 134.

Generally, the single error adjust and rearrangement circuit 94 is configured to correct a single bit error that may have been projected into a reconstructed column or columns, and is configured to forward the column zero data to its original column, if the code word is in encoding #2. Thus, the correction circuits 134 may perform one of two corrections. The DoAlias signals control the two types of correction. Particularly, the DoAlias[0][1:35] signals control whether or not a single bit error correction is made based on a corresponding syndrome bit, and the DoAlias[1][1:35] signals determine if the column 0 data is selected as the output instead of the (possibly corrected) input data. It is noted that the column 1 circuits may be eliminated, since column 1 stores only check bits and thus these bits need not be output. It is further noted that, in some embodiments, the column0 circuits may receive the class syndromes corresponding to column 0 instead of the output of the mux 136 to balance delay somewhat.

The control circuit 130 selects either the class syndrome or the auxiliary syndrome (repeated four times) through the mux 136 based on whether or not a DIMM failure has occurred. That is, if the DRAM_state is either State_1D or State_2RD, the control circuit 130 selects the class syndrome through the mux 136 as the Syndrome_Bits[0:3][0:7] and otherwise selects four copies of the auxiliary syndrome through the mux 136 as the Syndrome_Bits[0:3][0:7].

The column0 circuits 132 correct a projected single bit error in column 0 and forward the column 0 data to the correction circuits 134. An exemplary column0 circuit 132A is shown in FIG. 16 for the j$^{th}$ row of column 0, where 0<j<7 in this embodiment. Other similar circuits may be used for each row. If the DoAlias[0][0] signal is asserted and the Syndrome_Bits [0][j] bit is a one, the column0 circuit 132A inverts the Input_Bit[0][j] to produce Column0[j]. Otherwise, Input_Bit[0][j] is supplied as Column0[j] output. While a specific logic circuit 132A is shown in FIG. 16, any Boolean equivalent of the circuit may be used. Furthermore, other circuits may be used depending on whether the syndrome bits and/or the DoAlias signals are defined to be asserted high or low.

An exemplary correction circuit 134A is illustrated in FIG. 16 for the $i^{th}$ column and $j^{th}$ row of the output bits, where $0<j<7$ and $1<i<35$ in this embodiment Similar circuits may be used for each other row and column. If the DoAlias [1][i] signal is asserted, the Column0[j] bit is selected through the mux, thus moving the column 0 data to column i. If the DoAlias[1][i] signal is deasserted, either the Input_Bits[i][j] or its inverse (if the DoAlias[0][j] signal is asserted and the Syndrome_Bits[i mod 4][j] is a one) is selected as the output (thus correcting a possible projected single bit error). While a specific logic circuit 134A is shown in FIG. 16, any Boolean equivalent of the circuit may be used. Furthermore, other circuits may be used depending on whether the syndrome bits and/or the DoAlias signals are defined to be asserted high or low.

The control circuit 130 may generate the DoAlias signals as follows: If the DRAM_state is State_1, there is no reconstructed data and thus the DoAlias[0] and DoAlias[1] signals are deasserted. If the DRAM_state is State_1R, there is a DRAM failure and the code word is still in encoding #1. The DoAlias[0] signal for the failed DRAM is asserted to allow correction of a projected single bit error in the column and the DoAlias[1] signals are deasserted. If the DRAM_state is State_2R, there is a DRAM failure and the code word is in encoding #2. There is no reconstructed data, and thus the DoAlias[0] signals are deasserted since there is no projected single bit error. If the failed DRAM is one of DRAMs 1 to 35, the DoAlias[1] signal corresponding to the failed DRAM is asserted and other DoAlias[1] signals are deasserted. If the failed DRAM is one of DRAMS 35 to 39, the DoAlias[1] signal of the corresponding DRAM in DIMM_0 is asserted and other DoAlias[1] signals are deasserted. If the DRAM_state is State_ID, there is a DIMM failure and the code word is in encoding #1. The DoAlias[0] signals for the failed DIMM are asserted to allow correction of a projected single bit error in the reconstructed data, the remaining DoAlias[0] signals are deasserted, and the DoAlias[1] signals are deasserted. If the DRAM_state is State_2RD, there is a DIMM failure, a previous DRAM failure, and the code word is in encoding #2. The DoAlias[0] signals for the failed DIMM are asserted to allow correction of a projected single bit error in the reconstructed data and the remaining DoAlias[0] signals are deasserted. If the failed DRAM is one of DRAMs 1 to 35, the DoAlias[1] signal corresponding to the failed DRAM is asserted and other DoAlias[1] signals are deasserted. If the failed DRAM is one of DRAMS 35 to 39, the DoAlias[1] signal of the corresponding DRAM in DIMM_0 is asserted and other DoAlias[1] signals are deasserted.

Turning next to FIG. 17, a block diagram of one embodiment of the failed DRAM identify circuit 88 is shown for the exemplary implementation. Other embodiments are possible and contemplated.

The failed DRAM identify circuit 88 includes a set of XOR trees for each of DRAMs 1 to 35 (e.g. the Dram_1 XOR tree 140A for DRAM_1 and the Dram_35 XOR tree 140N for DRAM_35). The XOR trees are coupled to receive the auxiliary syndrome calculated by the syndrome compute circuit 84 and compute the inner syndrome which would result if the corresponding DRAM has failed (based on the corresponding header shown in FIG. 10) and resulted in the auxiliary syndrome. The auxiliary syndrome indicates which rows have a failure. The XOR tree for each DRAM calculates the inner syndrome that would occur assuming each row error exists within the column corresponding to that DRAM. If a row having an error is covered by a given inner check bit is the corresponding column, then the corresponding input bit to the XOR tree is asserted. The result of the XOR tree is then compared to the inner syndrome using comparators coupled to each XOR tree and coupled to receive the inner syndrome (e.g. comparators 142A and 142N in FIG. 17). If the result of the XOR tree equals the inner syndrome and the auxiliary syndrome is not zero then the DRAM 1 to 35 corresponding to that XOR tree is identified as the failed DRAM. In second mode, the rotational syndrome may be compared to the auxiliary syndrome, appended with a zero in the most significant bit and rotated left based on the column position (reference numerals 148A–148N). The comparison allows for both all bits to be equal and all bits to be not equal (since the rotational check bits are generated by XORing the $9^{th}$ bit with the remaining bits, which either changes each bit or leaves each bit unmodified). These outputs may verify the identification of DRAM 1 to DRAM 35 as the failed DRAM. In the first mode, the outputs of the comparators 150A–150N may be forced to binary one so as not to affect the results. AND gates 152A and 152N illustrate the above determination for DRAMs 1 and 35.

In the first mode, DRAM 0 may be identified as the failing DRAM if the auxiliary syndrome is not zero (zero check circuit 146) and the inner syndrome is zero (zero check circuit 144). In the second mode, the output of comparator 150A may be used to verify the selection of DRAM 0. AND gate 154 illustrates identifying DRAM 0 as the failing DRAM.

In the second mode, one of the DRAMs 36–39 may be identified as the failing DRAM. This occurs if the inner syndrome is zero (indirectly from the auxiliary syndrome being zero, zero check circuit 146), the rotational syndrome is zero (comparator 156) and one of the IsNz signals is asserted (AND gate 158 and gates 160A–160D). The control circuit 162 receives the failed DRAM signals and generates the DRAM_ID identifying the failed DRAM as well as the DRAM failure signal.

It is noted that the failed DRAM identify circuit 88 may identify a failed DRAM if the DRAM_state is State_1 and either a UError is asserted by the single error identification/correction circuit 92, or the inner syndrome is zero and one or more of the IsNz signals is asserted. The control circuit 162 may also assert an uncorrectable error signal (UError) if the failed DRAM identify circuit 88 is to identify a failed DRAM but none of the DRAM_XX Fail signals is asserted in FIG. 17.

It is noted that, while specific logic gates are illustrated in FIG. 17, other logic gates may be used. Boolean equivalents of those gates may also be used.

Turning next to FIG. 18, a block diagram of one embodiment of the failed DIMM identify circuit 90 is shown for the exemplary implementation. Other embodiments are possible and contemplated.

Similar to the failed DRAM identify circuit 88, the failed DIMM identify circuit 90 may employ XOR trees (e.g. XOR tree 170A for DIMM_0 and XOR tree 170N for DIMM_8 in FIG. 18) for each DIMM except for DIMM_9 to generate an inner syndrome which would result if the DIMM had failed and resulted in the class syndrome computed by the syndrome compute circuit 84, based on the headers for each column in the DIMM. The result of the XOR tree is compared (comparators 172A and 172N) to the inner syndrome. The XOR tree 170A also receives an input (Enc 1) indicating whether or not encoding #1 is being used. If encoding #1 is being used, the header for column 0 is zero. Thus, the portion of the class syndrome corresponding to column 0 may be ignored in encoding #1. For example, the portion of the class syndrome may be logically ANDed with the inverse of the Enc1 input. For DIMM_9, which is not included in the inner check bit generation, the inner syndrome is checked for zero (zero check circuit 174).

Additionally, the class syndrome may be used to generate a rotational syndrome, by adding a $9^{th}$ row of binary zeros and XORing bits along each diagonal to produce each bit of the rotational syndrome. The rotational syndrome generation is performed by the rotational syndrome generator 176, coupled to receive the class syndrome and to provide input to the rotators 178A–178N. Each rotator rotates the rotational error syndrome (zero for DIMM_0, 4 for DIMM_1, etc. up to 32 for DIMM_8). Similar to the failed DRAM identify circuit 88, the rotated syndromes are compared to the rotational syndrome supplied to the failed DIMM identify circuit for equality, or for differing in each bit (comparators 180A–180N). Since the rotational syndrome is not available in encoding #2 (DRAM 0 is storing data from a failed DRAM), the comparators 180A–180N are enabled in encoding #1 and forced to indicate equality in encoding #2.

A zero check circuit 182 is included to check whether or not the class syndrome is zero. If the class syndrome is zero, the failed DIMM identify circuit 90 does not detect a failing DIMM. One of DIMMs 0 to 8 may be identified as a failing DIMM if the class syndrome is not zero, the XOR tree result matches the inner syndrome, and (in encoding #1) the rotational syndrome identifies the DIMM (e.g. AND gates 184A and 184N for DIMM_0 and DIMM_8). DIMM_9 may be identified as the failing DIMM if the class syndrome is not zero, the inner syndrome is zero, and the rotational syndrome is zero (or all ones—comparator 186). AND gate 188 illustrates detection of DIMM_9 as the failed DIMM.

A control circuit 190 is coupled to receive the DIMM fail signals from the AND gates 184A–184N and the AND gate 188, and generates the DIMM_ID of a failed DIMM. It is noted that, in one embodiment, the failed DIMM identify circuit 90 may be used to identify a failed DIMM as follows: If the DRAM_state is State_1, the failed DIMM identify circuit 90 may be used if a UError is signaled by the single error identification/correction circuit 92 and by the failed DRAM identify circuit 88. If the DRAM_state is State_1R or State_2R, the failed DIMM identify circuit 90 may be used if a UError is signaled by the single error identification/correction circuit 92. The control circuit 190 may generate an uncorrectable error (UError) if the DRAM_state is either State_1D or State_2RD and the single error identification/correction circuit 92 signals a UError, since a DIMM failure has already been detected. The control circuit 190 may also generate a UError if the DRAM_state is State_1R and a DIMM failure is detected which is not the DIMM containing the failed DRAM. Additionally, the control circuit 190 may generate a UError if attempting to locate a failed DIMM and either none of the DIMM fail signals are asserted or more than one DIMM fail signal is asserted. In one embodiment, DIMM failure may be detected across both code words of the cache line to reduce the number of cases in which more than one DIMM fail is signaled. In such an embodiment, a DIMM detected as failing in both code words may be indicated as the failed DIMM, and a UError may be signaled if both code words detect the same two or more DIMMs as failing.

It is noted that, while specific logic gates are illustrated in FIG. 18, other logic gates may be used. Boolean equivalents of those gates may also be used.

It is noted that the XOR trees and corresponding comparators shown in FIGS. 17 and 18 may be merged into a combined circuit that produces a vector of 12 binary ones on its output to indicate equality, if desired.

It is noted that, while the exemplary implementation shown in FIGS. 8–18 employs specific sizes and numbers (e.g. 8 bits per code word in a DRAM, 4 DRAMs in a DIMM, 9 or 10 DIMMs in a bank), other implementations may vary these sizes or numbers as desired.

It is noted that the term "cyclic shift" has been used above. A cyclic shift of a value is a shift, where the bit shifted out of the value is reinserted at the opposite end of the value. For example, a cyclic left shift takes the bit or bits shifted out of the most significant positions and reinserts them in the least significant bits. A cyclic shift may also be referred to as a rotate.

Figure 19:
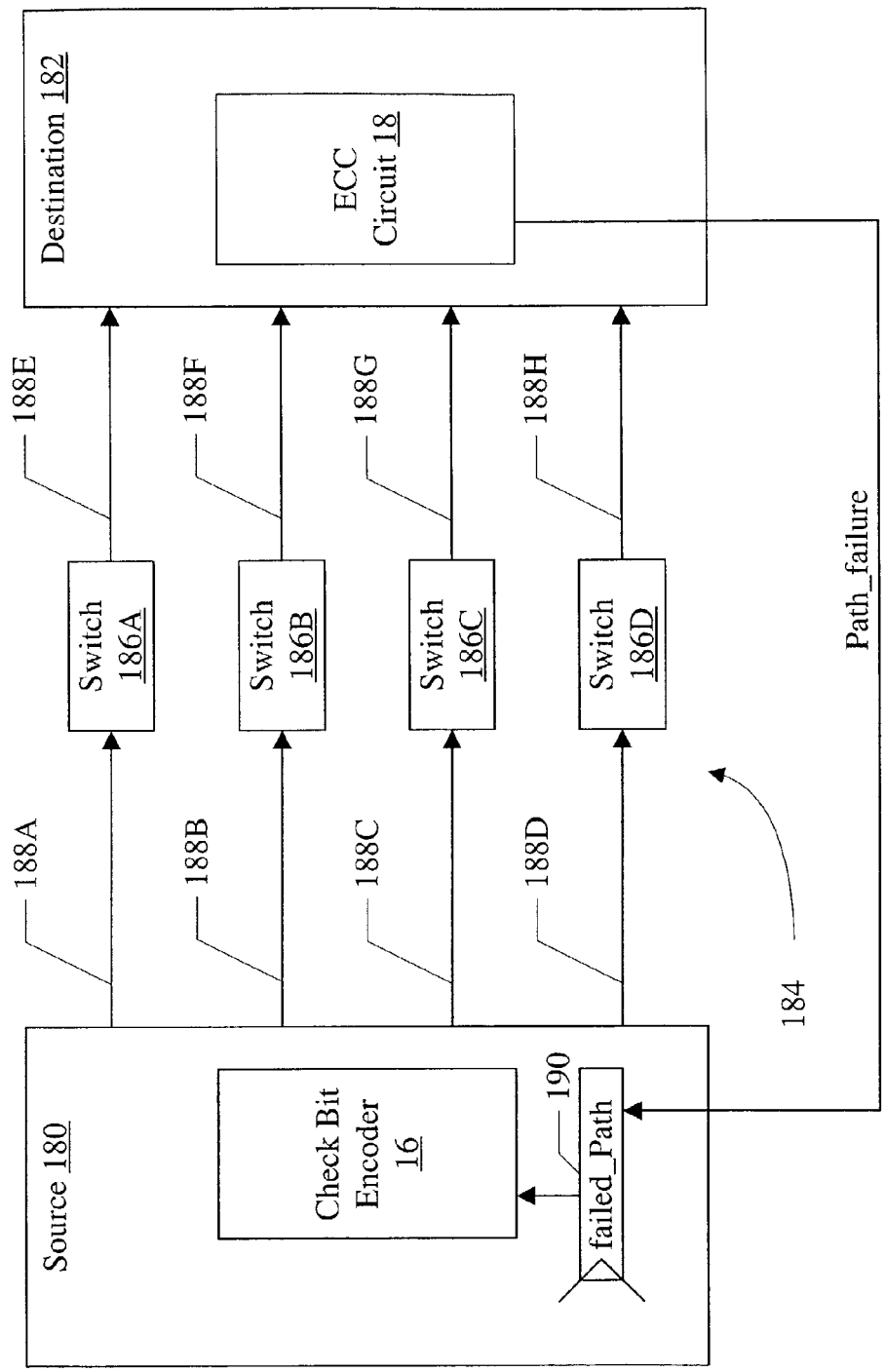
FIG. 19 is a block diagram of one embodiment of a communication system.

Turning now to FIG. 19, a block diagram of one embodiment of a communication system is shown. Other embodiments are possible and contemplated. In the embodiment of FIG. 19, the communication system includes a source device 180 and a destination device 182. The source device 182 includes the check bit encoder circuit 16 (which is similar to the above description with regard to FIGS. 1–18) and a persistent state storage 190 which may store an indication of a failed path. The check bit encoder circuit 16 is coupled to the persistent state storage 190, which is coupled to receive an indication of a path failure from the destination 182 (particularly, from the ECC circuit 18). The destination device 182 includes the ECC circuit 18 (which is similar to the above description with regard to FIGS. 1–18). The check bit encoder circuit 16 is coupled to receive unencoded data from within the source device 180 and is configured to encode a packet comprising one or more code words (including the data and check bits) for transmission over the transmission media 184 to the destination device 182. The ECC circuit 18 decodes the code words (detecting any errors according to the check bit definitions and optionally correcting detected errors), and may pass the corresponding received data internally to the destination device 182. The data from a code word that is transmitted through one of the switches 186A–186D may be referred to as a "slice".

In the illustrated embodiment, the transmission media 184 includes conductors coupled between the source device 180 and a set of switches 186 and conductors coupled between the switches 186 and the destination device 182. For example, FIG. 19 illustrates the conductors 188A between the source device 180 and the switch 186A; the conductors 188B between the source device 180 and the switch 186B; the conductors 188C between the source device 180 and the switch 186C; and the conductors 188D between the source device 180 and the switch 186D. Additionally, FIG. 19 illustrates the conductors 188E between the switch 186A and the destination device 182; the conductors 188F between the switch 186B and the destination device 182; the conductors 188G between the switch 186C and the destination device 182; and the conductors 188H between the switch 186D and the destination device 182. Each of conductors 188A–188H may comprise two or more conductors (that is, each switch 186A–186D may be coupled to at least two conductors from the source device 180 and at least two conductors to the destination device 182).

Figure 20:
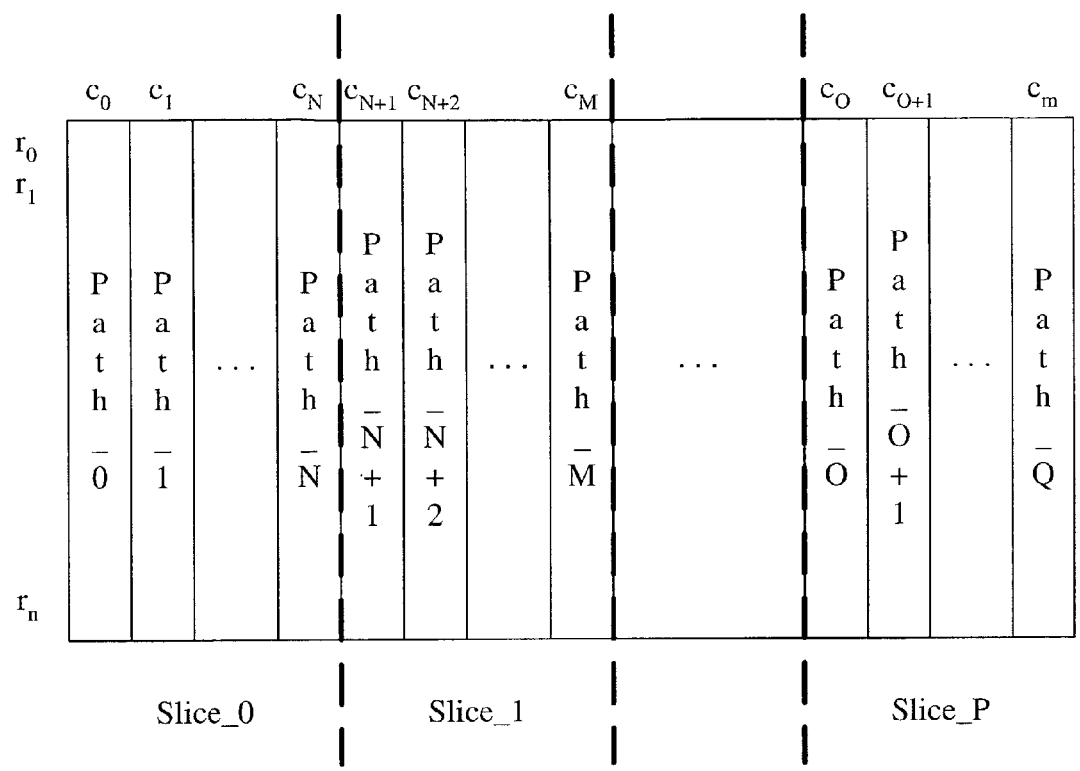
FIG. 20 is a block diagram of illustrating a logical array of data bits forming one embodiment of a code word, indicating the transmission of the bits on conductors within slices.

FIG. 20 illustrates one embodiment of a code word which may be used for transmitting data on the transmission medium 184. In the embodiment of FIG. 20, the code word is arranged as a logical array of rows and columns. Each column may correspond to one conductive path (or more briefly, "path") between the source device 180 and the destination device 182. For example, in the embodiment illustrated in FIG. 19, a conductive path may comprise a conductor within conductors 188A and a corresponding conductor within conductors 188E. Thus, in FIG. 20, column zero corresponds to path__0, column 1 corresponds to path__1, etc. Each transmission on a given path which forms part of the code word is a row of the code word. Thus, row 0 may be the first transmission on the paths, row 1 may be the second transmission on the paths, etc.

In the embodiment of FIG. 20, the columns of the array are further delimited by heavy dashed lines to illustrate slices (e.g. slice__0, slice__1, etc., through slice__p). Slice__0 may be the data transmitted through switch 186A, for example, while other slices may be the data transmitted through other switches. In embodiments in which slice failure is not detected, the slice delimiters may be ignored.

Generally, the various embodiments of check bits in accordance with the above described memory controller may be used in the communication system of FIG. 19. Switches 186 may be handled in a manner similar to the memory modules, and the paths may be handled in a manner similar to memory devices. That is, each switch 186A–186B may be treated, for check bit definition, similar to a memory module. Each path may be treated similar to a memory device. Check bits may be carried in any columns of the code word (e.g. column 0 may be used for auxiliary check bits, column 1 may be used for inner check bits, a portion of column 2 may be used for inner check bit duals, and a slice may optionally be used for outer check bits). Thus, for example, in various embodiments, a failure of a given path may be detected and corrected (and optionally mapped out). Single bit error correction may be supported before, during, and after a mapping out of a given path. Double bit error detection may be supported both before and after mapping out a given path. In embodiments in which a slice is used to carry outer check bits, a failure of a slice may be detected and probabilistically corrected. Single bit error correction and/or double bit error detection may be supported in such embodiments as well. In embodiments in which a column's worth of bits in the code word are unused, a path may be mapped out by mapping the bits transmitted on that path to the unused bits in the code word. Any of the above-described memory controller embodiments may be employed.

In the embodiment of FIG. 19, the FCC circuit 18 transmits a path failure indication to the source device 180 in response to detecting a path failure. The failing path may be "mapped out" in this case by ceasing use of the failing path for subsequent packets, and by using one of the other paths to transmit the bits previously transmitted on the failing path (e.g. unused paths or the path carrying the auxiliary check bits, similar to the above described memory device embodiments). In other embodiments, instead of transmitting the path__failure indication to the source device 180, the destination device 182 may inform a service processor of the failure. The service processor may inform the source device 180 (and any other source devices which may use the failing path) to cease using the failing path.

It is noted that, while a single switch is shown for each set of conductors in FIG. 19, each switch may actually be implemented as multiple switches in a hierarchical or peer-to-peer connection between the source device 180 and the destination device 182. Additionally, while a given switch is shown coupled between the source device 180 and the destination device 182, the switch may have additional connections to other destination devices (not shown in FIG. 19) and may route a packet from the source device 180 to one of the destination devices. Furthermore, in other embodiments, the switches 186A–186D may be replaced by any other transmission circuits (e.g. repeaters). Generally, a transmission circuit may include any circuitry coupled to two or more conductors and configured to transmit data on the conductors.

In other embodiments, no switches may be employed (e.g. there may be a point-to-point connection between the source device 180 and the destination device 182). In such embodiments, path failures may be detected in a manner similar to memory device failures.

Numerous variations and modifications will become apparent to those skilled in the art once the above disclosure is fully appreciated. It is intended that the following claims be interpreted to embrace all such variations and modifications.

What is claimed is:

1. A memory controller comprising:
a check bit encoder circuit coupled to receive a data block to be written to a memory comprising a plurality of memory devices, wherein the check bit encoder circuit is configured to encode the data block with a plurality of check bits to generate an encoded data block, wherein the plurality of check bits are defined to provide at least: (i) detection and correction of a failure of one of the plurality of memory devices; and (ii) detection and correction of a single bit error in the encoded data block following detection of the failure of one of the plurality of memory devices; wherein the memory controller is configured to write the encoded data block to the memory;
a check/correct circuit coupled to receive the encoded data block from the memory and configured to decode the encoded data block and perform at least the detection of (i) and (ii) on the encoded data block; and
a data remap control circuit coupled to the check/correct circuit, wherein the data remap control circuit is coupled to receive an identification of a failing memory device of the plurality of memory devices, and wherein the data remap control circuit is configured, in response to the check/correct circuit detecting (i), to read each data block for which the failing memory device stores at least one bit of the data block and for which at least one other bit of the data block is stored in a different one of the plurality of memory devices, and wherein the check bit encoder circuit is configured to recode the data block to avoid storing bits in the failing memory device and to write the recoded block to the plurality of memory devices.

2. The memory controller as recited in claim 1 wherein the check bit encoder circuit is configured to recode the data block including binary zeros for each bit stored in the failing memory device.

3. The memory controller as recited in claim 1 wherein the encoded data block is logically arranged as an array of rows (0 to R-1) and columns (0 to C-1) of bits, wherein each column comprises the bits stored in a different one of the plurality of memory devices, and wherein the plurality of check bits include a plurality of auxiliary check bits and a plurality of inner check bits, wherein the plurality of auxiliary check bits are stored in a first column of the array, and wherein each of the plurality of auxiliary check bits is in a row of the array and covers bits in the other columns of the array, and wherein each of the plurality of inner check bits covers selected bits of the encoded data block except for the plurality of auxiliary check bits, and wherein each bit of the array except for the plurality of auxiliary check bits has an associated assignment of one or more of the plurality of inner check bits that covers that bit, wherein the assignments are selected to satisfy the following, where $\text{syn}(r_x, c_y)$ is an inner syndrome associated with the bit at row x, column y of the array and XOR is bitwise exclusive OR:

for any set of rows $R_1$ of the array, wherein $R_1$ is not an empty set, and for any set of columns $c_1$ and $c_2$ of the array, wherein $c_1$ is not equal to $c_2$, an XOR of the syndromes corresponding to each position (r, c), where r is an element of R and c is an element of ($c_1$, $c_2$), is not equal to zero; and for any set of 2 distinct rows $r_1$ and $r_2$ and any set of 3 distinct columns $c_1$, $c_2$, and $c_3$, syn($r_1$, $c_1$) XOR syn ($r_2$, $c_2$) XOR syn($r_1$, $c_3$) XOR syn($r_2$, $c_3$) is not equal to zero.

4. The memory controller as recited in claim 3 wherein the plurality of check bits are further defined to detect a double bit error in the encoded data block following detection of the failure of one of the plurality of memory devices.

5. The memory controller as recited in claim 3 wherein, for a prime P>R for which each non-trivial P×P circulant matrix over Galois Field 2 (GF(2)) has rank P-1, the sets of inner check bits for the array are assigned by selecting a plurality of distinct P-bit binary vectors (labeled $K_0$ to $K_{C-1}$) such that there does not exist a pair of vectors $K_j$ and $K_1$ for which $K_j$ XOR $K_1$ equals the all ones vector, and wherein each of $K_0$ to $K_{C-1}$ is assigned to one of the columns of the array, and for each row in a given column $c_i$, the assignment is $K_i$ cyclically left-shifted by the number of positions equal to the row number.

6. The memory controller as recited in claim 5 wherein $K_0$ to $K_{C-1}$ are selected such that, for all sets of 3 distinct columns $c_1$, $c_2$, and $c_3$, $K_{c_1}$ XOR $K_{c_3}$ is not a cyclic shift of $K_{c_2}$ XOR $K_{c_3}$.

7. The memory controller as recited in claim 6 wherein, for all sets of distinct positions in the array ($r_1$, $c_1$) and ($r_2$, $c_2$), where $c_1$ and $c_2$ are not the first column, syn($r_1$, $c_1$) is not equal to syn($r_2$, $c_2$).

8. The memory controller as recited in claim 7 wherein, for all sets of distinct positions in the array ($r_1$, $c_1$), ($r_2$, $c_2$), and ($r_3$, $c_3$) where $c_1$, $c_2$ and $c_3$ are not the first column, syn($r_1$, $c_1$) XOR syn($r_2$, $c_2$) XOR syn($r_3$, $c_3$) is not equal to zero.

9. The memory controller as recited in claim 7 wherein each of the assignments of inner check bits selected for each of the positions that is not in the first column is odd weight.

10. The memory controller as recited in claim 3, wherein the first column is column zero.

11. The memory controller as recited in claim 1, wherein correction of a failure of one of the plurality of memory devices comprises reconstructing data bits that were stored in the one of the plurality of memory devices.

12. A method comprising:

encoding a data block to be written to a memory comprising a plurality of memory devices with a plurality of check bits to generate an encoded data block, wherein the plurality of check bits are defined to provide at least: (i) detection and correction of a failure of one of the plurality of memory devices; and (ii) detection and correction of a single bit error in the encoded data block following detection of the failure of one of the plurality of memory devices;

writing the encoded data block to the memory;

reading the encoded data block from the memory;

decoding the encoded data block and performing at least the detection of (i) and (ii) on the encoded data block; and in response to detecting (i):

reading each data block for which a failing memory device of the plurality of memory devices stores at least one bit of the data block;

recoding the data block to avoid storing bits in the failing memory device; and writing the recoded block to the plurality of memory devices.

13. The method as recited in claim 12 wherein the recoding comprises including, in the data block, binary zeros for each bit stored in the failing memory device.

14. The method as recited in claim 12 wherein the encoded data block is logically arranged as an array of rows (0 to R-1) and columns (0 to C-1) of bits, wherein each column comprises the bits stored in a different one of the plurality of memory devices, and wherein the plurality of check bits include a plurality of auxiliary check bits and a plurality of inner check bits, wherein the plurality of auxiliary check bits are stored in a first column of the array, and wherein each of the plurality of auxiliary check bits is in a row of the array and covers bits in the other columns of the array, and wherein each of the plurality of inner check bits covers selected bits of the encoded data block except for the plurality of auxiliary check bits, and wherein each bit of the array except the plurality of auxiliary check bits has an associated assignment of one or more of the plurality of inner check bits to cover that bit, wherein the assignments are selected to satisfy the following, where syn($r_x$, $c_y$) is the inner syndrome associated with the bit at row x, column y of the array and XOR is bitwise exclusive OR:

for any set of rows $R_1$ of the array, wherein $R_1$ is not an empty set, and for any set of columns $c_1$ and $c_2$ of the array, wherein $c_1$ is not equal to $c_2$, an XOR of the syndromes over each position (r, c), where r is an element of R and c is an element of ($c_1$, $c_2$), is not equal to zero; and for any set of 2 distinct rows $r_1$ and $r_2$ and any set of 3 distinct columns $c_1$, $c_2$, and $c_3$, syn($r_1$, $c_1$) XOR syn ($r_2$, $c_2$) XOR syn($r_1$, $c_3$) XOR syn($r_2$, $c_3$) is not equal to zero.

15. The method as recited in claim 14 wherein the plurality of check bits are further defined to detect a double bit error in the encoded data block following detection of the failure of one of the plurality of memory devices.

16. An apparatus comprising:

means for encoding a data block to be written to a memory comprising a plurality of memory devices with a plurality of check bits to generate an encoded data block, wherein the plurality of check bits are defined to provide at least: (i) detection and correction of a failure of one of the plurality of memory devices; and (ii) detection and correction of a single bit error in the encoded data block following detection of the failure of one of the plurality of memory devices; and means for writing the encoded data block to the memory;

means for reading the encoded data block from the memory; and means for decoding the encoded data block and performing at least the detection of (i) and (ii) on the encoded data block; and in response the means for decoding detecting (i):

the reading means reading each data block for which a failing memory device of the plurality of memory devices stores at least one bit of the data block;

the encoding means recoding the data block to avoid storing bits in the failing memory device; and the writing means writing the recoded block to the plurality of memory devices.

17. A memory controller comprising:

a check bit encoder circuit coupled to receive a data block to be written to a memory comprising a plurality of memory devices, wherein the check bit encoder circuit is configured to encode the data block with a plurality of check bits to generate an encoded data block, wherein the plurality of check bits are defined to provide at least: (i) detection and correction of a failure of one of the plurality of memory devices; and (ii) detection of a double bit error in the encoded data block following detection of the failure of one of the plurality of memory devices; wherein the memory controller is configured to write the encoded data block to the memory; and a check/correct circuit coupled to receive the encoded data block from the memory and configured to decode the encoded data block and perform at least the detection of (i) and (ii) on the encoded data block;

wherein the encoded data block is logically arranged as an array of rows (0 to R-1) and columns (0 to C-1) of bits, wherein each column comprises the bits stored in a different one of the plurality of memory devices, and wherein the plurality of check bits include a plurality of auxiliary check bits and a plurality of inner check bits, wherein the plurality of auxiliary check bits are stored in a first column of the array, and wherein each of the plurality of auxiliary check bits is in a row of the array and covers bits in the other columns of the array, and wherein each of the plurality of inner check bits covers selected bits of the encoded data block except for the plurality of auxiliary check bits, and wherein each bit of the array except for the plurality of auxiliary check bits has an associated assignment of one or more of the plurality of inner check bits that covers that bit, wherein the assignments are selected to satisfy the following, where $syn(r_x, c_y)$ is the inner syndrome associated with the bit at row x, column y of the array and XOR is bitwise exclusive OR:

for any set of rows $R_1$ of the array, wherein $R_1$ is not an empty set, and for any set of columns $c_1$ and $c_2$ of the array, wherein $c_1$ is not equal to $c_2$, an XOR of the syndromes over each position (r, c), where r is an element of R and c is an element of($c_1$, $c_2$), is not equal to zero; and for any set of 2 distinct rows $r_1$ and $r_2$ and any set of 3 distinct columns $c_1$, $c_2$, and $c_3$, $syn(r_1, c_1)$ XOR syn ($r_2$, $c_2$) XOR $syn(r_1, c_3)$ XOR $syn(r_2, c_3)$ is not equal to zero.

18. The memory controller as recited in claim 17 wherein, for a prime P>R for which each P×P non-trivial circulant matrix over GF(2) has rank P-1, the assignments for the array are assigned by selecting a plurality of distinct P-bit binary vectors (labeled $K_0$ to $K_1$) such that there does not exist a pair of vectors $K_i$ and $K_j$ for which $K_i$ XOR $K_j$ equals the all ones vector, and wherein each of $K_0$ to $K_{C-1}$ is assigned to one of the columns of the array, and for each row in a given column $c_i$, the assignment is $K_j$ cyclically left-shifted by the number of positions equal to the row number.

19. The memory controller as recited in claim 18 wherein $K_0$ to $K_{C-1}$ are selected such that, for any set of 3 distinct columns $c_1$, $c_2$, and $c_3$, $K_{c_1}$ XOR $K_{c_3}$ is not a cyclic shift of $K_{c_2}$ XOR $K_{c_3}$.

20. The memory controller as recited in claim 19 wherein, for any set of distinct positions in the array ($r_1$, $c_1$), ($r_2$, $c_2$), and ($r_3$, $c_3$) where $c_1$, $c_2$ and $c_3$ are not the first column, $syn(r_1, c_1)$ XOR $syn(r_2, c_2)$ XOR $syn(r_3, c_3)$ is not equal to zero.

21. The memory controller as recited in claim 19 wherein each of the assignments selected for each of the positions that is not in the first column is odd weight.

22. A communication system comprising:

a check bit encoder circuit coupled to receive a data block to be transmitted via a transmission medium comprising a plurality of paths, wherein the check bit encoder circuit is configured to encode the data block with a plurality of check bits to generate an encoded data block, wherein the plurality of check bits are defined to provide at least: (i) detection and correction of a failure of one of the plurality of paths; and (ii) detection of a double bit error in the encoded data block following detection of the failure of one of the plurality of paths; and a check/correct circuit coupled to receive the encoded data block from the transmission medium and configured to decode the encoded data block and perform at least the detection of (i) and (ii) on the encoded data block;

wherein the encoded data block is logically arranged as an array of rows (0 to R-1) and columns (0 to C-1) of bits, wherein each column comprises the bits transmitted via a different one of the plurality of paths, and wherein the plurality of check bits include a plurality of auxiliary check bits and a plurality of inner check bits, wherein the plurality of auxiliary check bits are in a first column of the array, and wherein each of the plurality of auxiliary check bits is in a row of the array and covers bits in the other columns of the array, and wherein each of the plurality of inner check bits covers selected bits of the encoded data block except for the plurality of auxiliary check bits, and wherein each bit of the array except for the plurality of auxiliary check bits has an associated assignment of one or more of the plurality of inner check bits that covers that bit, wherein the assignments are selected to satisfy the following, where $syn(r_x, c_y)$ is the inner syndrome associated with the bit at row x, column y of the array and XOR is bitwise exclusive OR:

for any set of rows $R_1$ of the array, wherein $R_1$ is not an empty set, and for any set of columns $c_1$ and $c_2$ of the array, wherein $c_1$ is not equal to $c_2$, an XOR of the syndromes over each position (r, c), where r is an element of R and c is an element of ($c_1$, $c_2$), is not equal to zero; and for any set of 2 distinct rows $r_1$ and $r_2$ and any set of 3 distinct colunms $c_1$, $c_2$, and $c_3$, $syn(r_1, c_1)$ XOR syn ($r_2$, $c_2$) XOR $syn(r_1, c_3)$ XOR $syn(r_2, c_3)$ is not equal to zero.

23. The communication system as recited in claim 22 wherein, for a prime P>R for which each P×P non-trivial circulant matrix over GF(2) has rank P-1, the assignments for the array are assigned by selecting a plurality of distinct P-bit binary vectors (labeled $K_0$ to $K_{C-1}$) such that there does not exist a pair of vectors $K_i$ and $K_j$ for which $K_i$ XOR $K_j$ equals the all ones vector, and wherein each of $K_0$ to $K_{C-1}$ is assigned to one of the columns of the array, and for each row in a given column $c_i$, the assignment is $K_i$ cyclically left-shifted by the number of positions equal to the row number.

24. The communication system as recited in claim 23 wherein $K_0$ to $K_{C-1}$ are selected such that, for any set of 3 distinct columns $c_1$, $c_2$, and $c_3$, $K_{c_1}$ XOR $K_{c_3}$ is not a cyclic shift of $K_{c_2}$ XOR $K_{c_3}$.

25. The communication system as recited in claim 24 wherein, for any set of distinct positions in the array $(r_1, c_1)$, $(r_2, c_2)$, and $(r_3, c_3)$ where $c_1$, $c_2$ and $c_3$ are not the first column, $syn(r_1, c_1)$ XOR $syn(r_2, c_2)$ XOR $syn(r_3, c_3)$ is not equal to zero.

26. The communication system as recited in claim 24 wherein each of the assignments selected for each of the positions that is not in the first column is odd weight.

* * * * *

UNITED STATES PATENT AND TRADEMARK OFFICE
CERTIFICATE OF CORRECTION

PATENT NO.   : 6,973,613 B2
DATED        : December 6, 2005
INVENTOR(S)  : Robert E. Cypher It is certified that error appears in the above-identified patent and that said Letters Patent is hereby corrected as shown below:

<u>Column 34,</u>
Line 54, delete "and".

Signed and Sealed this

Twenty-first Day of March, 2006

JON W. DUDAS
*Director of the United States Patent and Trademark Office*